(12) United States Patent
Peace et al.

(10) Patent No.: US 6,447,633 B1
(45) Date of Patent: Sep. 10, 2002

(54) REACTOR FOR PROCESSING A SEMICONDUCTOR WAFER

(75) Inventors: Steven L. Peace; Gary L. Curtis; Raymon F. Thompson; Brian Aegerter; Curt T. Dundas, all of Kalispell, MT (US)

(73) Assignee: Semitdol, Inc., Kalispell, MT (US)

( * ) Notice: Subject to any disclaimer, the term of this patent is extended or adjusted under 35 U.S.C. 154(b) by 0 days.

(21) Appl. No.: 09/710,530

(22) Filed: Nov. 9, 2000

Related U.S. Application Data

(60) Division of application No. 09/437,711, filed on Nov. 10, 1999, which is a continuation-in-part of application No. PCT/US99/05676, filed on Mar. 15, 1999, and a continuation-in-part of application No. 09/113,435, filed on Jul. 10, 1998, and a continuation-in-part of application No. 09/041,901, filed on Mar. 13, 1998.
(60) Provisional application No. 60/116,750, filed on Jan. 22, 1999.

(51) Int. Cl.$^7$ ................................................. C28F 1/02
(52) U.S. Cl. .................... 156/345; 438/694; 438/782; 438/906; 438/913; 118/52; 118/56; 118/620; 118/500; 118/715; 118/730; 156/345
(58) Field of Search .................. 438/694, 906–913, 438/780–82; 427/521–60; 118/50–56, 314–319, 620, DIG. 11, 500, 730, 715; 156/345

(56) References Cited

U.S. PATENT DOCUMENTS

| | | | |
|---|---|---|---|
| 3,727,620 A | | 4/1973 | Orr |
| 3,953,265 A | | 4/1976 | Hood |
| 4,132,567 A | | 1/1979 | Blackwood |
| 4,276,855 A | * | 7/1981 | Seddon ........................ 118/719 |
| 4,286,541 A | * | 9/1981 | Blackwood ................... 118/52 |
| 4,439,243 A | | 3/1984 | Titus |
| 4,439,244 A | | 3/1984 | Allevato |

(List continued on next page.)

FOREIGN PATENT DOCUMENTS

| | | | |
|---|---|---|---|
| EP | 09769725 A2 | * 10/1996 | ............. G03F/7/30 |
| JP | 59-208831 | 11/1984 | |
| JP | 60-137016 | 7/1985 | |
| JP | 61-196534 | 8/1986 | |
| JP | 62-166515 | 7/1987 | |
| JP | 63-185029 | 7/1988 | |
| JP | 1-120023 | 5/1989 | |
| JP | 4 94537 | 3/1992 | |
| JP | 5-13322 | 1/1993 | |
| JP | 5-21332 | 1/1993 | |
| JP | 5-326483 | 12/1993 | |
| JP | 6-45302 | 2/1994 | |
| JP | 52-12576 | 1/1997 | |
| JP | 1-283845 | 11/1999 | |

*Primary Examiner*—Matthew Smith
*Assistant Examiner*—Granville D Lee
(74) *Attorney, Agent, or Firm*—Lyon & Lyon LLP

(57) ABSTRACT

A method for processing a semiconductor wafer or similar article includes the step of spinning the wafer and applying a fluid to a first side of the wafer, while it is spinning. The fluid flows radially outwardly in all directions, over the first side of the wafer, via centrifugal force. As the fluid flows off of the circumferential edge of the wafer, it is contained in an annular reservoir, so that the fluid also flows onto an outer annular area of the second side of the wafer. An opening allows fluid to flow out of the reservoir. The opening defines the location of a parting line beyond which the fluid will not travel on the second side of the wafer. An apparatus for processing a semiconductor wafer or similar article includes a reactor having a processing chamber formed by upper and lower rotors. The wafer is supported between the rotors. The rotors are rotated by a spin motor. A processing fluid is introduced onto the top or bottom surface of the wafer, or onto both surfaces, at a central location. The fluid flows outwardly uniformly and in all directions. A wafer support automatically lifts the wafer, so that it can be removed from the reactor by a robot, when the rotors separate from each other after processing.

39 Claims, 25 Drawing Sheets

U.S. PATENT DOCUMENTS

| | | |
|---|---|---|
| 4,544,446 A | 10/1985 | Cady |
| 4,664,133 A | 5/1987 | Silvernail et al. |
| 4,750,505 A | 6/1988 | Inuta et al. |
| 4,790,262 A | 12/1988 | Nakayama et al. |
| 4,838,289 A | 6/1989 | Kottman et al. |
| 4,903,717 A | 2/1990 | Sumnitsch |
| 4,982,215 A | 1/1991 | Matsuoka |
| 4,982,753 A | 1/1991 | Grebinski, Jr. et al. |
| 5,020,200 A | 6/1991 | Mimasaka |
| 5,032,217 A | 7/1991 | Tanaka |
| 5,117,769 A | 6/1992 | DeBoer |
| 5,168,886 A | 12/1992 | Thompson et al. |
| 5,209,180 A | 5/1993 | Shoda et al. |
| 5,222,310 A | 6/1993 | Thompson et al. |
| 5,224,503 A | 7/1993 | Thompson et al. |
| 5,224,504 A | 7/1993 | Thompson et al. |
| 5,349,978 A | 9/1994 | Sago et al. |
| 5,361,449 A | 11/1994 | Akimoto |
| 5,421,893 A | 6/1995 | Perlov |
| 5,431,421 A | 7/1995 | Thompson et al. |
| 5,445,172 A | 8/1995 | Thompson et al. |
| 5,500,081 A * | 3/1996 | Bergman ................. 156/646.1 |
| 5,513,594 A | 5/1996 | McClanahan et al. |
| 5,551,986 A | 9/1996 | Jain |
| 5,591,262 A | 1/1997 | Sago et al. |
| 5,616,069 A | 4/1997 | Walker et al. |
| 5,666,985 A | 9/1997 | Smith, Jr. et al. |
| 5,677,824 A | 10/1997 | Harashima et al. |
| 5,678,116 A | 10/1997 | Sugimoto et al. |
| 5,718,763 A | 2/1998 | Tateyama et al. |
| 5,762,708 A | 6/1998 | Motoda et al. |
| 5,762,751 A | 6/1998 | Bleck et al. |
| 5,779,796 A | 7/1998 | Tomoeda et al. |
| 5,815,762 A | 9/1998 | Sakai et al. |
| 5,845,662 A | 12/1998 | Sumnitsch |
| 5,860,640 A | 1/1999 | Marohl et al. |
| 5,868,866 A | 2/1999 | Maekawa et al. |
| 5,882,433 A | 3/1999 | Ueno |
| 5,885,755 A | 3/1999 | Nakagawa et al. |
| 5,916,366 A | 6/1999 | Ueyama et al. |
| 5,942,035 A | 8/1999 | Hasebe et al. |
| 5,952,050 A | 9/1999 | Doan |
| 5,997,653 A | 12/1999 | Yamasaka |
| 6,063,190 A * | 5/2000 | Hasebe et al. ................. 118/52 |
| 6,090,205 A * | 7/2000 | Sakai et al. ................. 118/500 |
| 6,251,692 B1 * | 6/2001 | Hanson ........................ 438/7 |
| 6,264,752 B1 * | 7/2001 | Curtis et al. ................. 118/729 |

\* cited by examiner

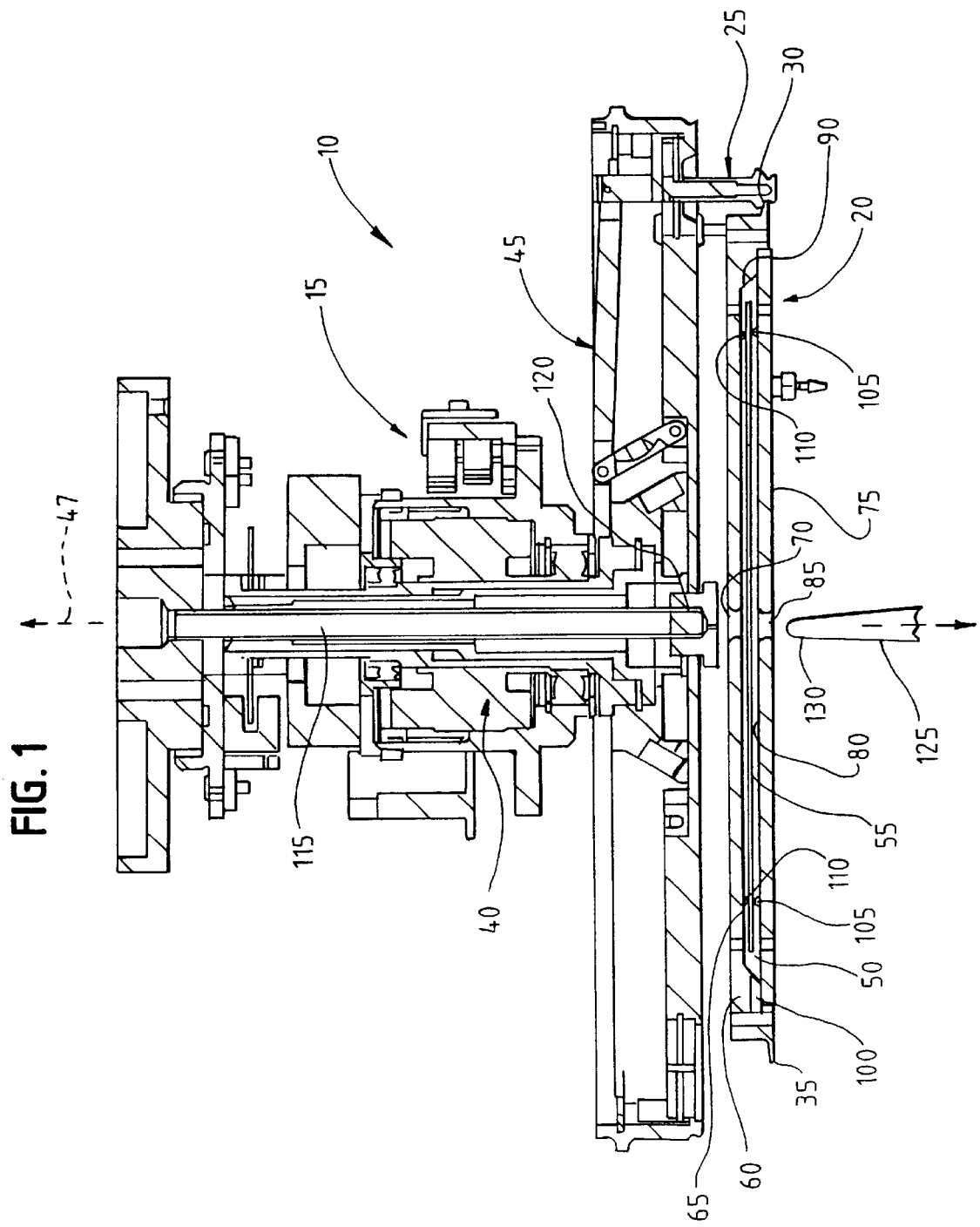

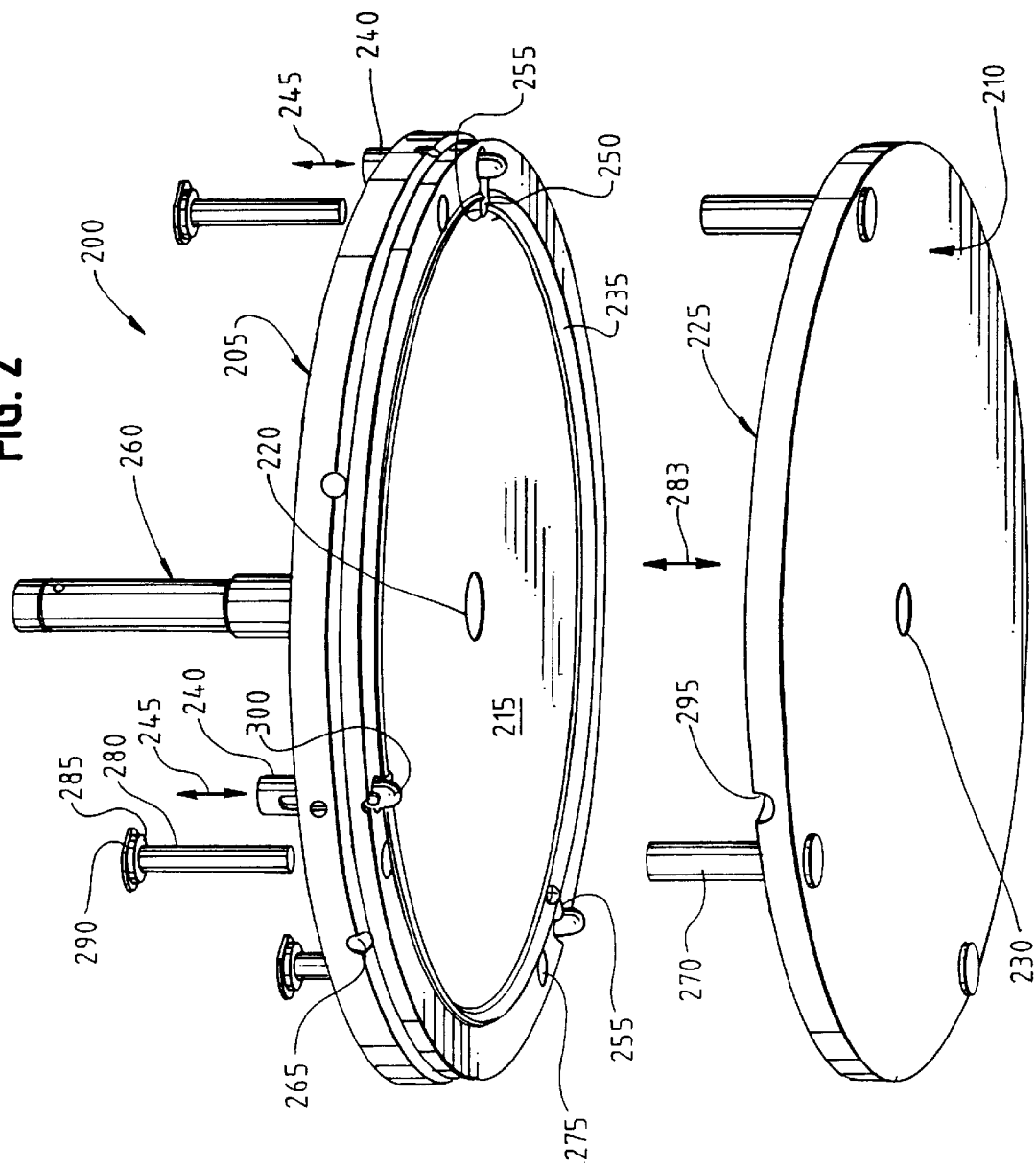

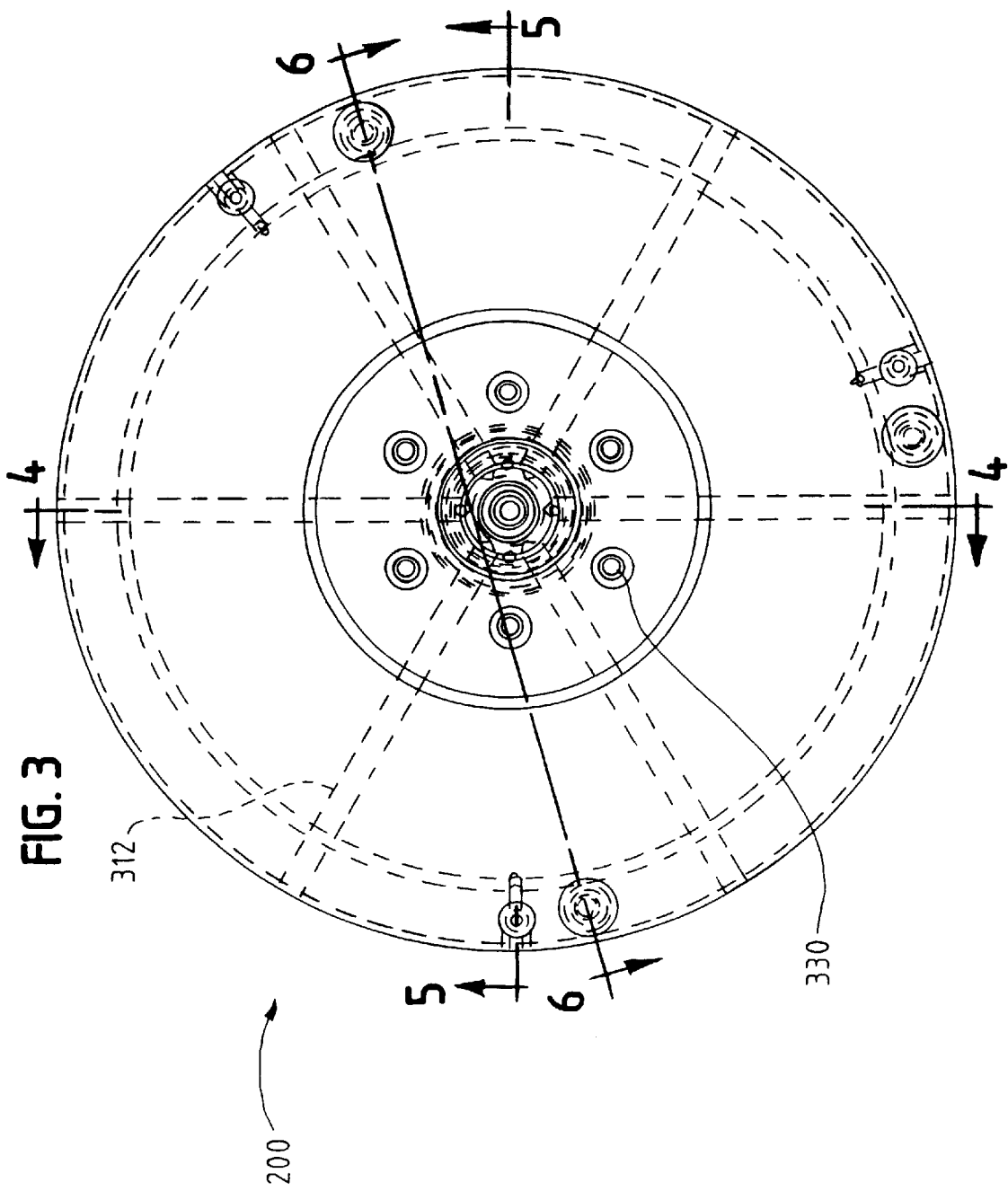

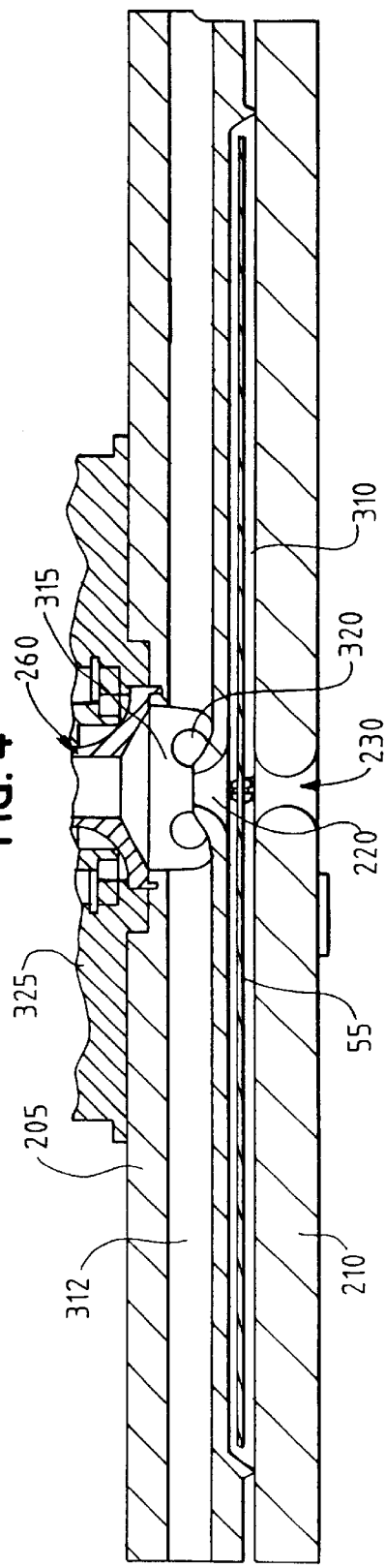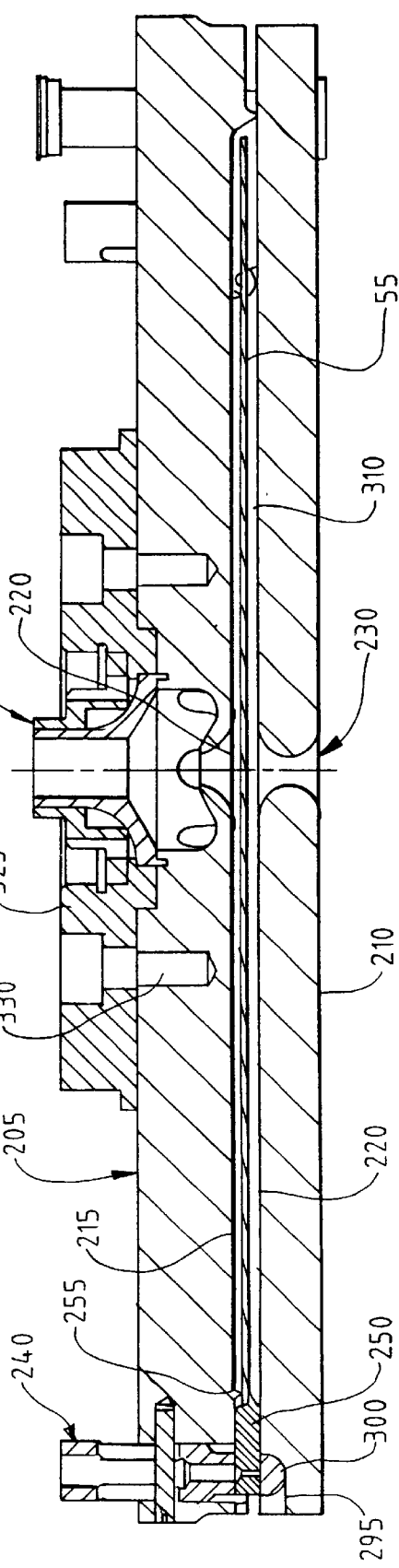

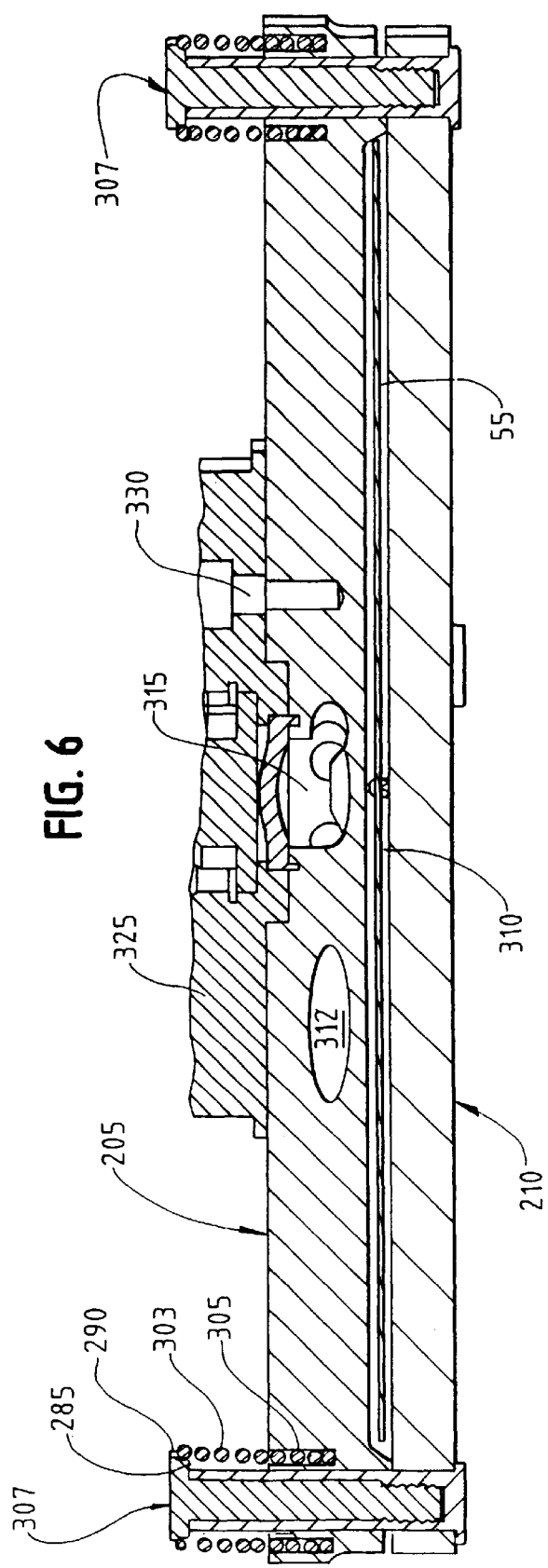

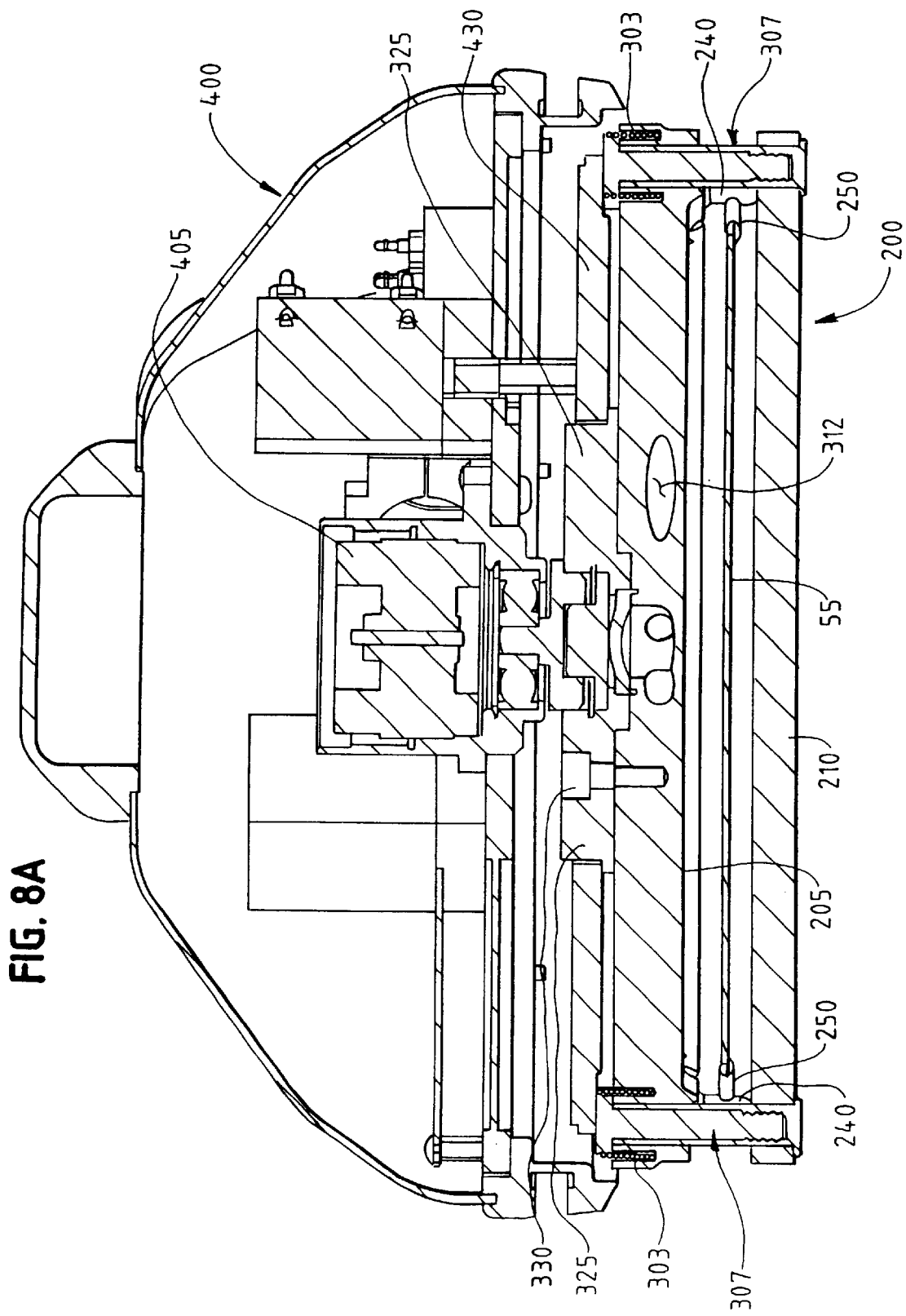

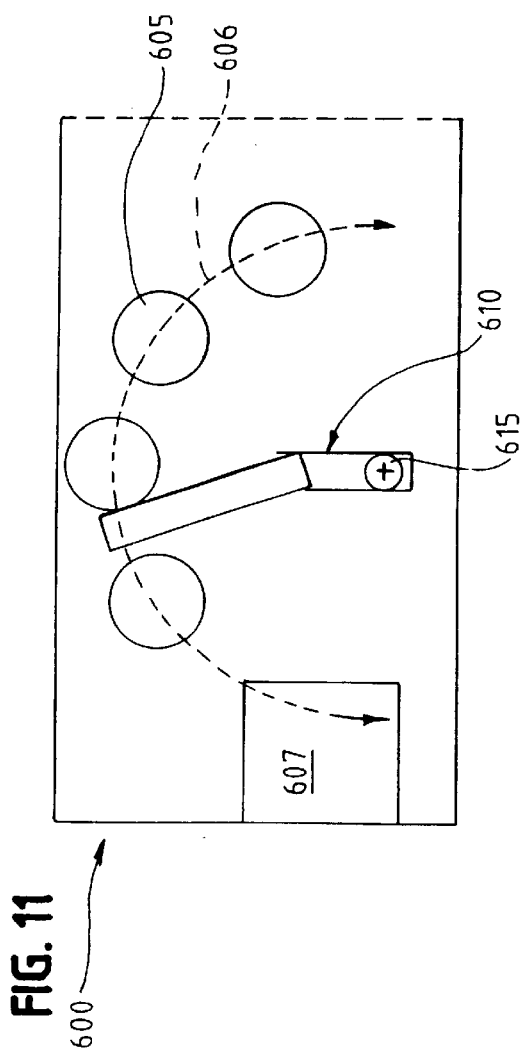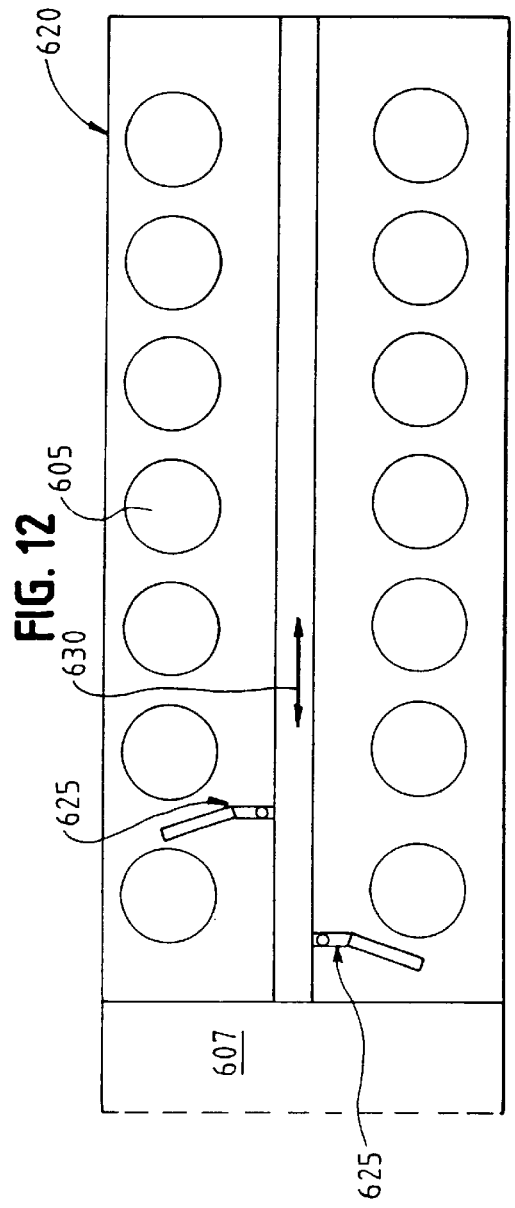

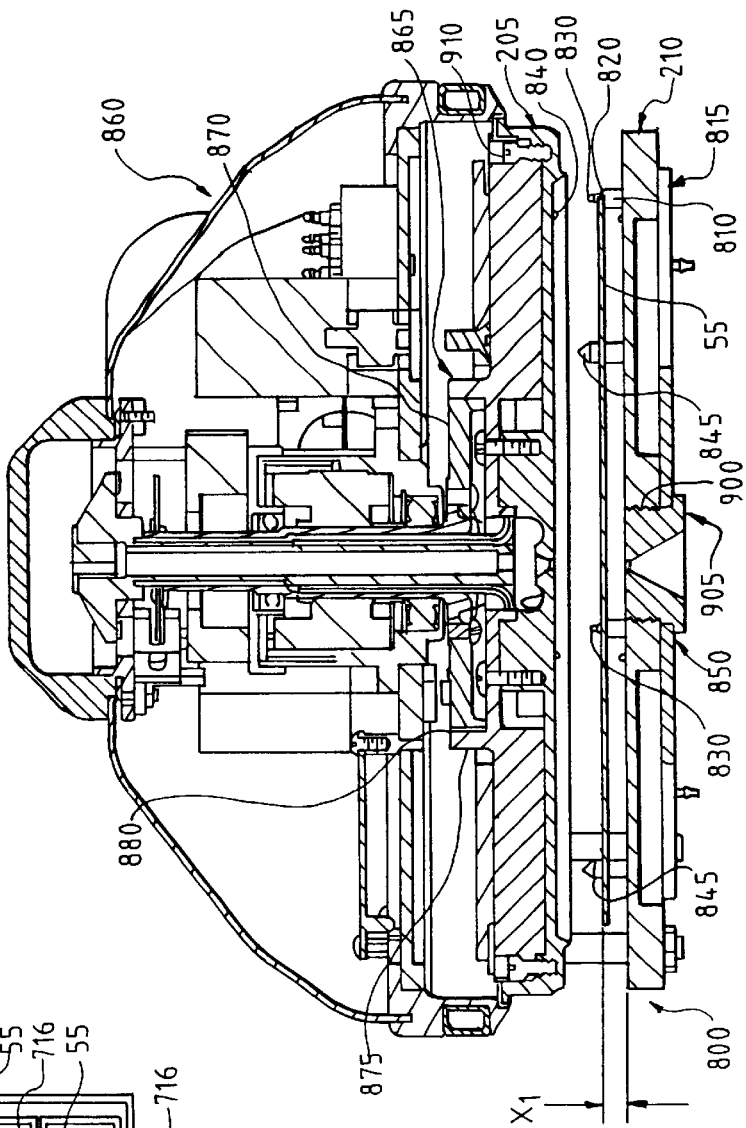
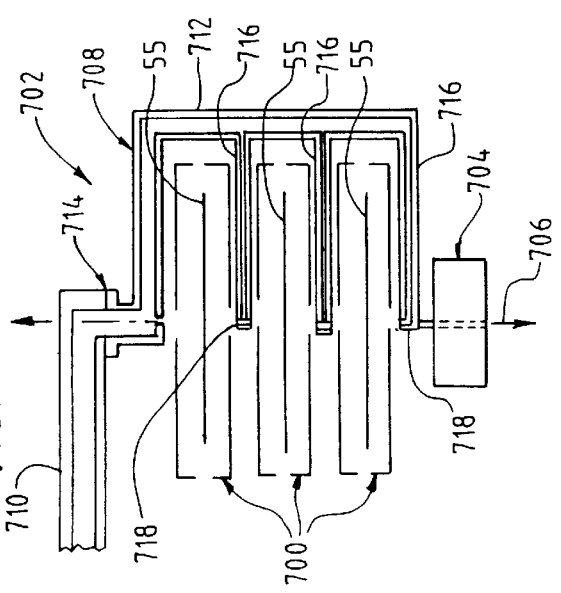
FIG. 13
FIG. 14

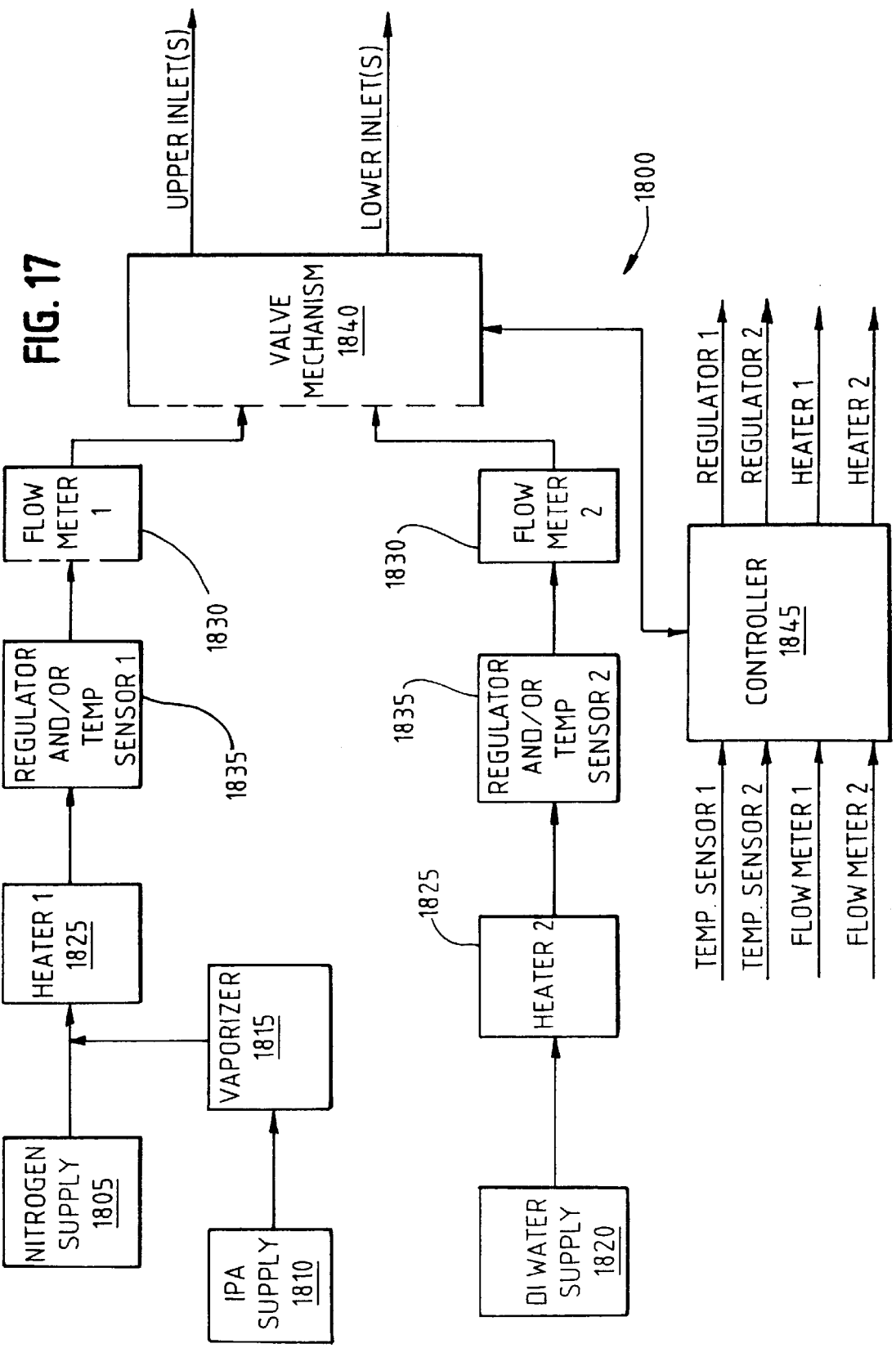

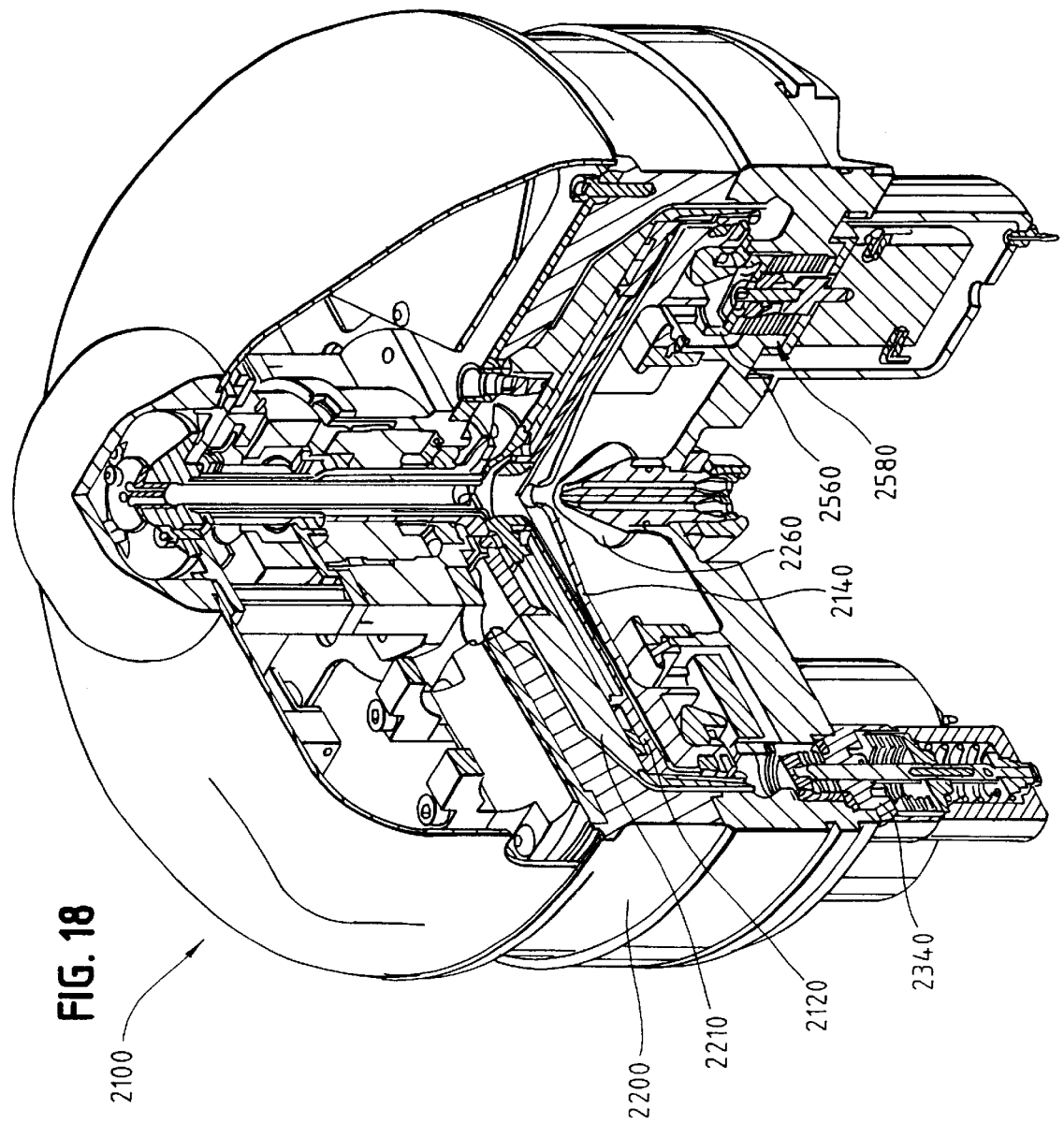

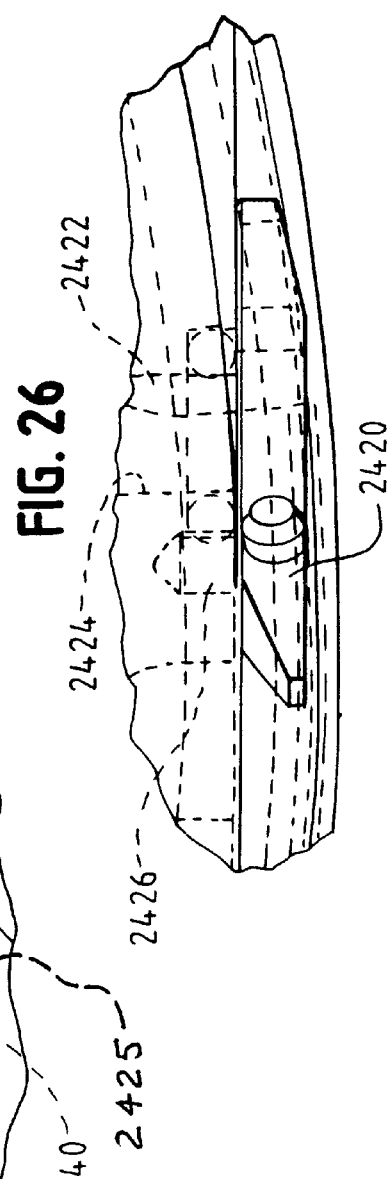
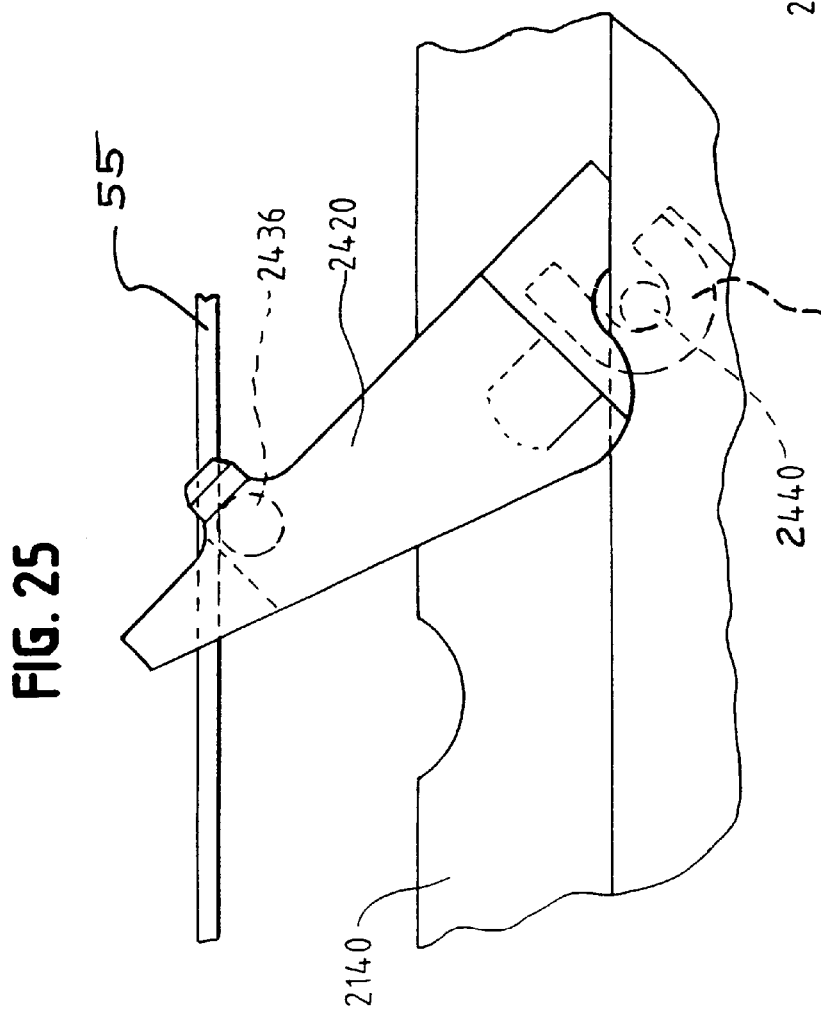

REACTOR FOR PROCESSING A SEMICONDUCTOR WAFER

This application is a Divisional of U.S. patent application Ser. No. 09/437,711, filed Nov. 10, 1999, and now pending, which is a Continuation-In-Part of: International Patent Application No. PCT/US99/05676, filed Mar. 15, 1999, and now expired; U.S. patent application Ser. No. 60/116,750 filed Jan. 23, 1999, and now abandoned; U.S. patent application Ser. No. 09/113,435, filed Jul. 10, 1998, and now pending; and U.S. patent application Ser. No. 09/041,901, filed Mar. 13, 1998, and now pending. Priority to these applications is claimed under 35 U.S.C. §§120 and 365, and they are incorporated herein by reference.

BACKGROUND OF THE INVENTION

The semiconductor manufacturing industry is constantly seeking to improve the processes used to manufacture microelectronic circuits and components, such as the manufacture of integrated circuits from e.g., silicon wafers. The improvements come in various forms but, generally, have one or more objectives as the desired goal. The objectives of many of these improved processes include: 1) decreasing the amount of time required to process a wafer to form the desired integrated circuits; 2) increasing the yield of usable integrated circuits per wafer by, for example, decreasing the likelihood of contamination of the wafer during processing; 3) reducing the number of steps required to turn a wafer into the desired integrated circuits; and 4) reducing the cost of processing the wafers into the desired integrated circuit by, for example, reducing the costs associated with the chemicals required for the processing.

In the processing of wafers, it is often necessary to subject one or more sides of the wafer to a fluid in either liquid, vapor or gaseous form. Such fluids are used to, for example, etch the wafer surface, clean the wafer surface, dry the wafer surface, passivate the wafer surface, deposit films on the wafer surface, etc. Control of the physical parameters of the processing fluids, such as their temperature, molecular composition, dosing, etc., is often quite crucial to the success of the processing operations. As such, the introduction of such fluids to the surface of the wafer occurs in a controlled environment. Typically, such wafer processing occurs in what has commonly become known as a reactor.

Various reactor constructions and configurations are known and used in the industry. However, it has now been recognized that demands for future semiconductor manufacturing processes may ultimately require more control and economic efficiency from the reactor. As such, a substantially new approach to processing and reactor design has been undertaken, with the objective of providing greater control of the fluid processes currently used in connection with microelectronic manufacturing, and to provide improved processes.

BRIEF SUMMARY OF THE INVENTION

An apparatus for processing a workpiece in a microenvironment is set forth.

Workpiece is defined as an object that at least comprises a substrate, and may include further layers of material or manufactured components, such as one or more metallization levels, disposed on the substrate. The apparatus includes a workpiece housing preferably connected to be rotated by a rotor motor. The workpiece housing further defines a substantially closed processing chamber in which one or more processing fluids are distributed across at least one face of the workpiece by centrifugal accelerations generated during rotation of the housing.

Additionally, the reactor includes several advantageous mechanical features including those that allow the reactor to be used with robotic wafer transfer equipment, those that allow the reactor to be readily re-configured for different processes, and those that allow the processing chamber of the reactor to be easily removed and serviced.

BRIEF DESCRIPTION OF THE DRAWINGS

FIG. 1 is a cross-sectional view of a microelectronic workpiece housing and a rotor assembly constructed in accordance with one embodiment of the invention.

FIG. 2 is an exploded view of a further embodiment of a microelectronic workpiece housing constructed in accordance with the teachings of the present invention FIG. 3 is a top plan view of the workpiece housing of FIG. 2 when the housing is in an assembled state.

FIG. 4 is a cross-sectional view of the workpiece housing taken along line IV—IV of FIG. 3.

FIG. 5 is a cross-sectional view of the workpiece housing taken along line V—V of FIG. 3.

FIG. 6 is a cross-sectional view of the workpiece housing taken along line VI—VI of FIG. 3.

FIGS. 8A and 8B are cross-sectional views showing the workpiece housing in an open state and connected to a rotary drive assembly.

FIGS. 11 and 12 are schematic diagrams of exemplary processing tools that employ the present invention.

FIG. 13 illustrates a batch wafer processing tool constructed in accordance with the principles of the present invention.

FIG. 14 illustrates a further embodiment of a reactor including features that render it well-suited for integration with workpiece transfer automation equipment, wherein the reactor is in an open state for loading/unloading a workpiece that is to be processed.

FIG. 17 illustrates a system in which the foregoing reactor is used to implement a rinsing/drying process.

FIG. 18 is a cut-away, perspective view of another reactor embodiment.

FIGS. 25 and 26 are further enlarged details of one of the lifting levers shown in FIG. 24.

DETAILED DESCRIPTION OF THE INVENTION

Figure 7A:
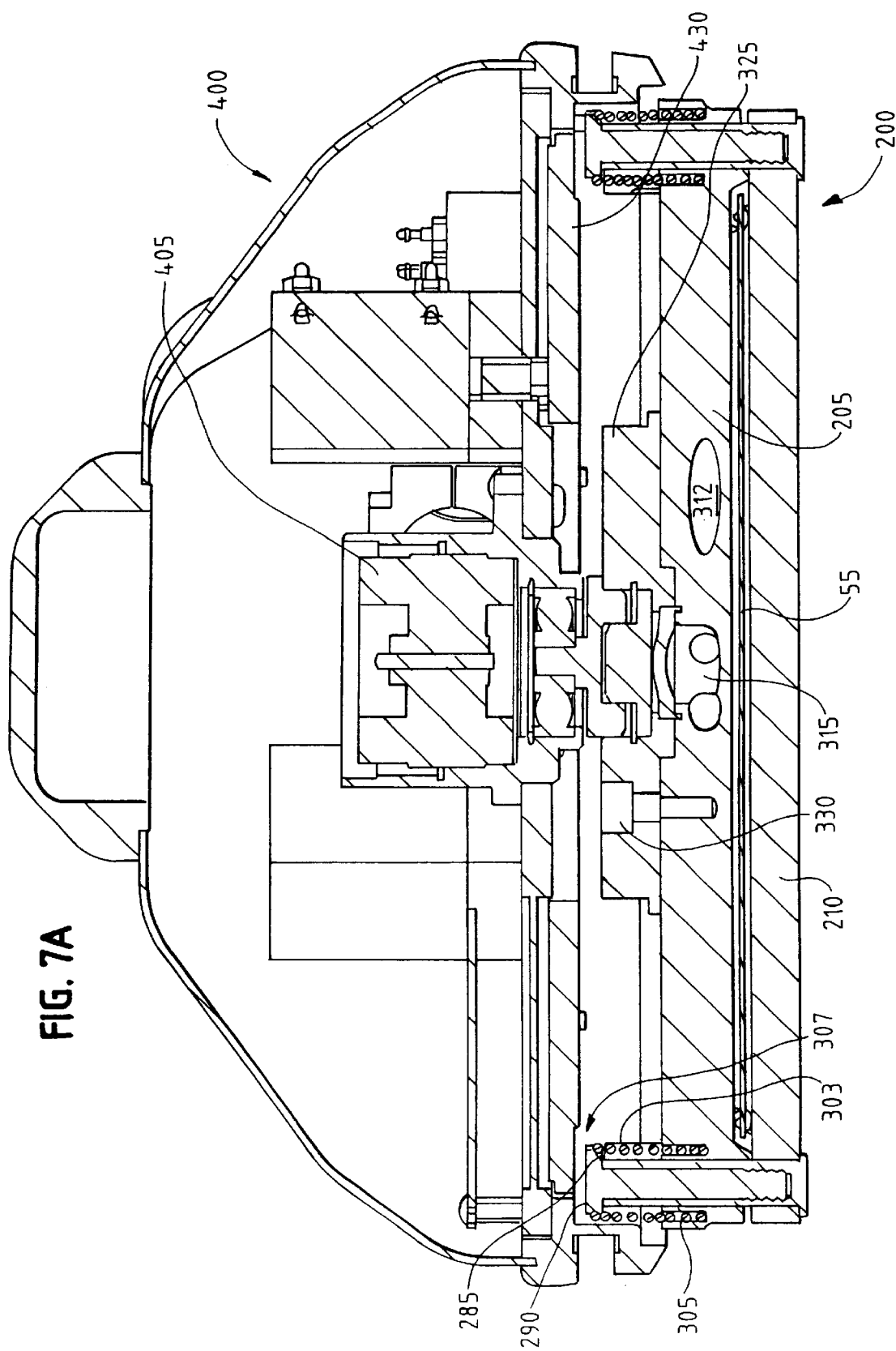
FIGS. 7A and 7B are cross-sectional views showing the workpiece housing in a closed state and connected to a rotary drive assembly.

FIG. 1 is a cross-sectional view of one embodiment of a reactor, shown generally at 10, constructed in accordance with the teachings of the present invention. The embodiment of the reactor 10 of FIG. 1 is generally comprised of a rotor portion 15 and a microelectronic workpiece housing 20. The rotor portion 15 includes a plurality of support members 25 that extend downwardly from the rotor portion 15 to engage the workpiece housing 20. Each of the support members 25 includes a groove 30 that is dimensioned to engage a radially extending flange 35 that extends about a peripheral region of the workpiece housing 20. Rotor portion 15 further includes a rotor motor assembly 40 that is disposed to rotate a hub portion 45, including the support members 25, about a central axis 47. Workpiece housing 20 is thus secured for co-rotation with hub portion 45 when support members 25 are engaged with flange 35. Other constructions of the rotor portion 15 and the engagement mechanism used for securement with the workpiece housing 20 may also be used.

The workpiece housing 20 of the embodiment of FIG. 1 defines a substantially closed processing chamber 50. Preferably, the substantially closed processing chamber 50 is formed in the general shape of a semiconductor wafer or microelectronic workpiece 55 and closely conforms with the surfaces of the workpiece. The specific construction of FIG. 1 includes an upper rotor or chamber member 60 having an interior chamber face 65. The upper chamber member 60 includes a centrally disposed fluid inlet opening 70 in the interior chamber face 65. The specific construction also includes a lower rotor or chamber member 75 having an interior chamber face 80. The lower chamber member 75 has a centrally disposed fluid inlet opening 85 in the interior chamber face 80. The upper chamber member 60 and the lower chamber member 75 engage one another to define the processing chamber 50. The upper chamber member 60 includes sidewalls 90 that project downward from the interior chamber face 65. One or more outlets 100 are disposed at the peripheral regions of the processing chamber 50 through the sidewalls 90 to allow fluid within the chamber 50 to exit therefrom through centripetal acceleration that is generated when the housing 20 is rotated about axis 47.

In the illustrated embodiment, the microelectronic workpiece 55 is a generally circular wafer having upper and lower planar surfaces. As such, the processing chamber 50 is generally circular in plan view and the interior chamber faces 65 and 80 are generally planar and parallel to the upper and lower planar surfaces of the workpiece 55. The spacing between the interior chamber faces 65 and 80 and the upper and lower planar surfaces of the workpiece 55 is generally quite small. Such spacing is preferably minimized to provide substantial control of the physical properties of a processing fluid flowing through the interstitial regions. In the embodiment shown, the spacing between the chamber faces and the workpiece upper and lower surfaces are about equal to the thickness of the wafer, e.g., 0.5–1.2 mm, and typically about 0.8 Mm.

The wafer 55 is spaced from the interior chamber face 80 by a plurality of spacing members 105 extending from the interior chamber face 80. Preferably, a further set of spacing members 110 extend from the interior chamber face 65 and are aligned with the spacing members 105 to grip the wafer 55 therebetween.

Fluid inlet openings 70 and 85 provide communication passageways through which one or more processing fluids may enter the chamber 50 for processing the wafer surfaces. In the illustrated embodiment, processing fluids are delivered from above the wafer 55 to inlet 70 through a fluid supply tube 115 having a fluid outlet nozzle 120 disposed proximate inlet 70. Fluid supply tube 115 extends centrally through the rotor portion 15 and is preferably concentric with the axis of rotation 47. Similarly, processing fluids are delivered from below the wafer 55 to inlet 85 through a fluid supply tube 125. Fluid supply tube 125 terminates at a nozzle 130 disposed proximate inlet 85. Although nozzles 120 and 130 terminate at a position that is spaced from their respective inlets, it will be recognized that tubes 115 and 125 may be extended so that gaps are not present. Rather, nozzles 120 and 130 or tubes 115 and 125 may include rotating seal members that abut and seal with the respective upper and lower chamber members 60 and 75 in the regions of the inlets 70 and 85. In such instances, care should be exercised in the design of the rotating joint so as to minimize any contamination resulting from the wear of any moving component.

During processing, one or more processing fluids are individually or concurrently supplied through fluid supply tubes 115 and 125 and inlets 70 and 85 for contact with the surfaces of the workpiece 55 in the chamber 50. Preferably, the housing 20 is rotated about axis 47 by the rotor portion 15 during processing to generate a continuous flow of any fluid within the chamber 50 across the surfaces of the workpiece 55 through the action of centripetal acceleration. Processing fluid entering the inlet openings 70 and 85 are thus driven across the workpiece surfaces in a direction radially outward from the center of the workpiece 55 to the exterior perimeter of the workpiece 55. At the exterior perimeter of the workpiece 55, any spent processing fluid is directed to exit the chamber 50 through outlets 100 as a result of the centripetal acceleration. Spent processing fluids may be accumulated in a cup reservoir disposed below and/or about the workpiece housing 20. As will be set forth below in an alternative embodiment, the peripheral regions of the workpiece housing 20 may be constructed to effectively separate the processing fluids provided through inlet 70 from the processing fluids supplied through inlet 85 so that opposite surfaces of wafer 55 are processed using different processing fluids. In such an arrangement, the processing fluids may be separately accumulated at the peripheral regions of the housing 20 for disposal or re-circulation.

In the embodiment of FIG. 1, the workpiece housing 20 may constitute a single wafer pod that may be used to transport the workpiece 55 between various processing stations and/or tools. If transport of the housing 20 between the processing stations and/or tools takes place in a clean room environment, the various openings of the housing 20 need not be sealed. However, if such transport is to take place in an environment in which wafer contaminants are present, sealing of the various housing openings should be effected. For example, inlets 70 and 85 may each be provided with respective polymer diaphragms having slits disposed therethrough. The ends of fluid supply tubes 115 and 125 in such instances may each terminate in a tracor structure that may be used to extend through the slit of the respective diaphragm and introduce the processing fluid into the chamber 50. Such tracor/slitted diaphragm constructions are used in the medical industry in intravenous supply devices. Selection of the polymer material used for the diaphragms should take into consideration the particular processing fluids that will be introduced therethrough. Similar sealing of the outlets 100 may be undertaken in which the tracor structures are inserted into the diaphragms once the housing 20 is in a clean room environment.

Alternatively, the outlets 100 themselves may be constructed to allow fluids from the processing chamber to exit therethrough while inhibiting the ability of fluids to proceed from the exterior of housing 20 into chamber 50. This effect may be achieved, for example, by constructing the openings 100 as nozzles in which the fluid flow opening has a larger diameter at the interior of chamber 50 than the diameter of the opening at the exterior of the housing 20. In a further construction, a rotational valve member may be used in conjunction with the plurality of outlets 100. The valve member, such as a ring with openings corresponding to the position of outlets 100, would be disposed proximate the opening 100 and would be rotated to seal with the outlets 100 during transport. The valve member would be rotated to a position in which outlets 100 are open during processing. Inert gas, such as nitrogen, can be injected into the chamber 50 through supply tubes 115 and 125 immediately prior to transport of the housing to a subsequent tool or processing station. Various other mechanisms for sealing the outlets 100 and inlets 70 and 85 may also be employed.

FIG. 2 is a perspective view of a further reactor construction wherein the reactor is disposed at a fixed processing station and can open and close to facilitate insertion and extraction of the workpiece. The reactor, shown generally at 200, is comprised of separable upper and lower rotors or chamber members, 205 and 210, respectively. As in the prior embodiment, the upper chamber member 205 includes a generally planar chamber face 215 having a centrally disposed inlet 220. Although not shown in the view of FIG. 2, the lower chamber member 210 likewise has a generally planar interior chamber face 225 having a central inlet 230 disposed therethrough. The upper chamber member 205 includes a downwardly extending sidewall 235 that, for example, may be formed from a sealing polymer material or may be formed integrally with other portions of member 205.

The upper and lower chamber members, 205 and 210, are separable from one another to accept a workpiece therebetween. With a workpiece 55 disposed between them, the upper and lower rotors or chamber members, 205 and 210, move toward one another to form a chamber in which the workpiece is supported in a position in which it is spaced from the planar interior chamber faces 215 and 225. In the embodiment of the reactor disclosed in FIGS. 2–8B, the workpiece, such as a semiconductor wafer, is clamped in place between a plurality of support members 240 and corresponding spacing members 255 when the upper and lower chamber members are joined to form the chamber (see FIG. 7B). Axial movement of the upper and lower chamber members toward and away from each other is facilitated by a plurality of fasteners 307, the construction of which will be described in further detail below. Preferably, the plurality of fasteners 307 bias the upper and lower chambers to a closed position such as illustrated at FIG. 7A.

In the disclosed embodiment, the plurality of wafer support members 240 extend about a peripheral region of the upper chamber member 205 at positions that are radially exterior of the sidewall 235. The wafer support members 240 are preferably disposed for linear movement along respective axes 245 to allow the support members 240 to clamp the wafer against the spacing members 255 when the upper and lower chamber members are in a closed position (see FIG. 7A), and to allow the support members 240 to release the wafer from such clamping action when the upper and lower chamber members are separated (see FIG. 8A). Each support member 240 includes a support arm 250 that extends radially toward the center of the upper chamber member 205. An end portion of each arm 250 overlies a corresponding spacing member 255 that extends from the interior chamber face 215. Preferably, the spacing members 255 are each in the form of a cone having a vertex terminating proximate the end of the support arm 250. Notches 295 are disposed at peripheral portions of the lower chamber member 210 and engage rounded lower portions 300 of the wafer support members 240. When the lower chamber member 210 is urged upward to the closed position, notches 295 engage end portions 300 of the support members 240 and drive them upward to secure the wafer 55 between the arms 250 of the supports 240 and the corresponding spacing members 255. This closed state is illustrated in FIG. 5. In the closed position, the notches 295 and corresponding notches 296 of the upper chamber member (see FIG. 2) provide a plurality of outlets at the peripheral regions of the reactor 200. Radial alignment of the arm 250 of each support member 240 is maintained by a set pin 308 that extends through lateral grooves 309 disposed through an upper portion of each support member.

Figure 7B:
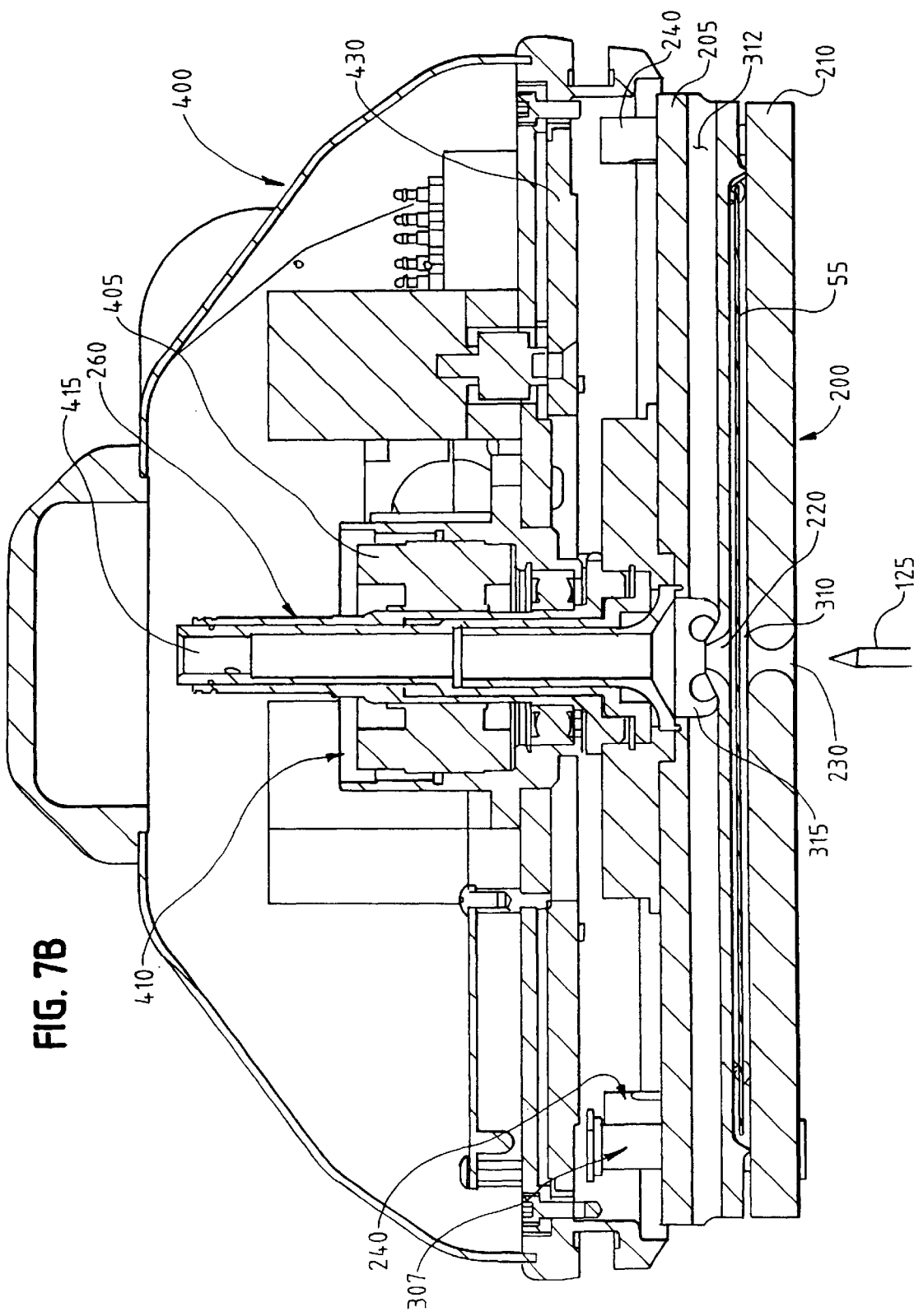

The construction of the fasteners 307 that allow the upper and lower chamber members to be moved toward and away from one another is illustrated in FIGS. 2, 6 and 7B. As shown, the lower rotor or chamber member 210 includes a plurality of hollow cylinders 270 that are fixed thereto and extend upward through corresponding apertures 275 at the peripheral region of the upper rotor or chamber member 205 to form lower portions of each fastener 307. Rods 280 extend into the hollow of the cylinders 270 and are secured to form an upper portion of each fastener 307. Together, the rods 280 and cylinders 270 form the fasteners 307 that allow relative linear movement between the upper and lower chamber members, 205 and 210, along axis 283 between the open and closed position. Two flanges, 285 and 290, are disposed at an upper portion of each rod 280. Flange 285 functions as a stop member that limits the extent of separation between the upper and lower chamber members, 205 and 210, in the open position. Flanges 290 provide a surface against which a biasing member, such as a spring (see FIG. 6) or the like, acts to bias the upper and lower chamber members, 205 and 210, to the closed position.

With reference to FIG. 6, the spring 303 or the like, has a first end that is positioned within a circular groove 305 that extends about each respective fastener 307. A second end of each spring is disposed to engage flange 290 of the respective fastener 307 in a compressed state thereby causing the spring to generate a force that drives the fastener 307 and the lower chamber member 210 upward into engagement with the upper chamber member 205.

The reactor 200 is designed to be rotated about a central axis during processing of the workpiece. To this end, a centrally disposed shaft 260 extends from an upper portion of the upper chamber member 205. As will be illustrated in further detail below in FIGS. 7A–8B, the shaft 260 is connected to engage a rotary drive motor for rotational drive of the reactor 200. The shaft 260 is constructed to have a centrally disposed fluid passageway (see FIG. 4) through which a processing fluid may be provided to inlet 220. Alternatively, the central passageway may function as a conduit for a separate fluid inlet tube or the like.

As illustrated in FIGS. 3 and 4, a plurality of optional overflow passageways 312 extend radially from a central portion of the upper chamber member 205. Shaft 260 terminates in a flared end portion 315 having inlet notches 320 that provide fluid communication between the upper portion of processing chamber 310 and the overflow passageways 312. The flared end 315 of the shaft 260 is secured with the upper chamber member 205 with, for example, a mounting plate 325. Mounting plate 325, in turn, is secured to the upper chamber member 205 with a plurality of fasteners 330 (FIG. 5). Overflow passages 312 allow processing fluid to exit the chamber 310 when the flow of fluid to the chamber 310 exceeds the fluid flow from the peripheral outlets of the chamber.

Figure 8B:
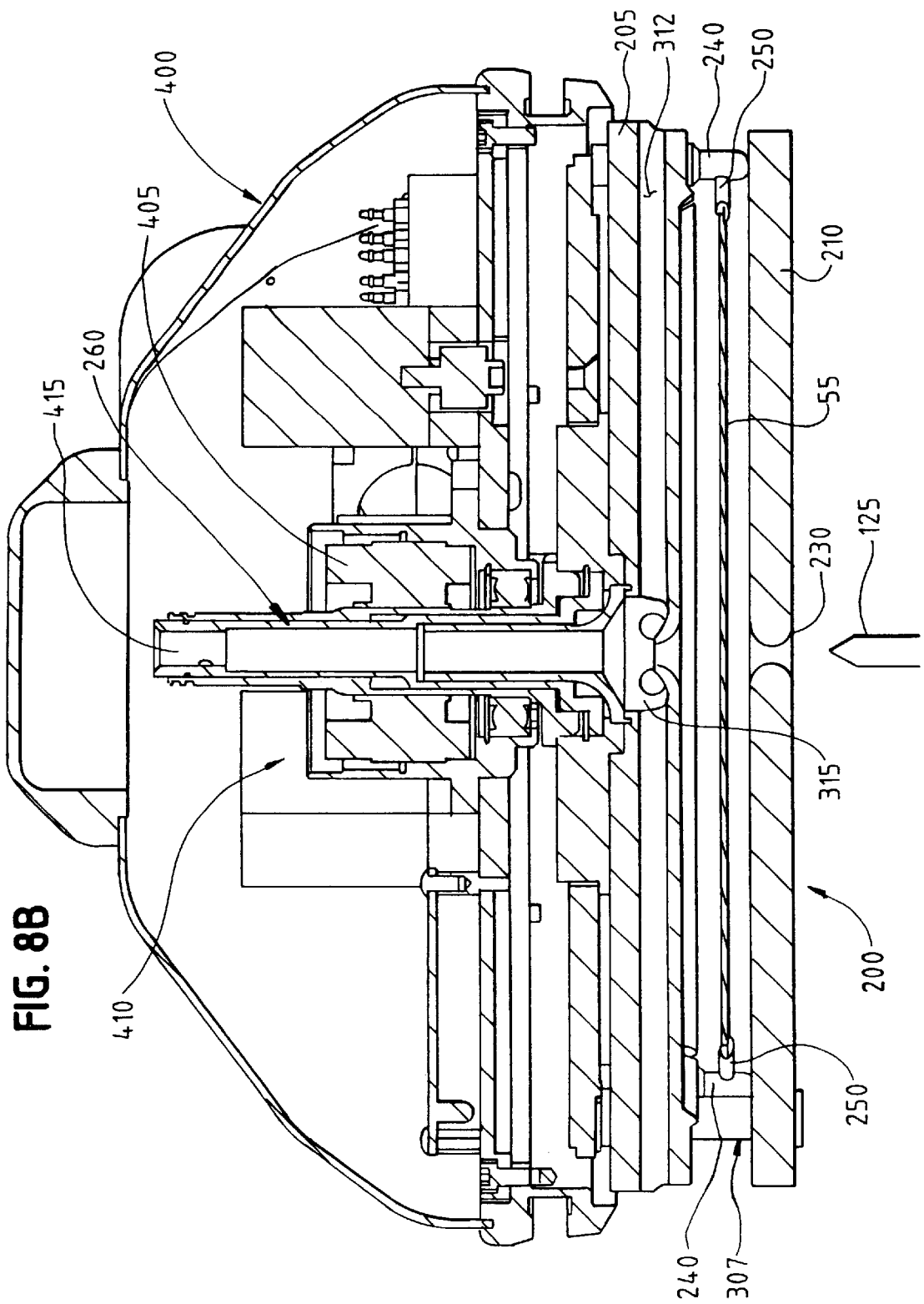

FIGS. 7A and 7B are cross-sectional views showing the reactor 200 in a closed state and connected to a rotary drive assembly, shown generally at 400, while FIGS. 8A and 8B are similar cross-sectional views showing the reactor 200 in an opened state. As shown, shaft 260 extends upward into the rotary drive assembly 400. Shaft 260 is provided with the components necessary to cooperate with a stator 405 to form a rotary drive motor assembly 410.

As in the embodiment of FIG. 1, the upper and lower chamber members 205 and 210 join to define the substantially closed processing chamber 310 that, in the preferred embodiment, substantially conforms to the shape of the workpiece 55. Preferably, the wafer 55 is supported within the chamber 310 in a position in which its upper and lower faces are spaced from the interior chamber faces 215 and 225. As described above, such support is facilitated by the support members 240 and the spacing members 255 that clamp the peripheral edges of the wafer 55 therebetween when the reactor 200 is in the closed position of FIGS. 7A and 7B.

It is in the closed state of FIGS. 7A and 7B that processing of the wafer 55 takes place. With the wafer secured within the processing chamber 310, processing fluid is provided through passageway 415 of shaft 260 and inlet 220 into the interior of chamber 310. Similarly, processing fluid is also provided to the chamber 310 through a processing supply tube 125 that directs fluid flow through inlet 230. As the reactor 200 is rotated by the rotary drive motor assembly 410, any processing fluid supplied through inlets 220 and 230 is driven across the surfaces of the wafer 55 by forces generated through centripetal acceleration. Spent processing fluid exits the processing chamber 310 from the outlets at the peripheral regions of the reactor 200 formed by notches 295 and 296. Such outlets exist since the support members 240 are not constructed to significantly obstruct the resulting fluid flow. Alternatively, or in addition, further outlets may be provided at the peripheral regions.

Once processing has been completed, the reactor 200 is opened to allow access to the wafer, such as shown in FIGS. 8A and 8B. After processing, actuator 425 is used to drive an actuating ring 430 downward into engagement with upper portions of the fasteners 307. Fasteners 307 are driven against the bias of spring 303 causing the lower chamber member 210 to descend and separate from the upper chamber member 205- As the lower chamber member 210 is lowered, the support members 240 follow it under the influence of gravity, or against the influence of a biasing member, while concurrently lowering the wafer 55. In the lower position, the reactor chamber 310 is opened thereby exposing the wafer 55 for removal and/or allowing a new wafer to be inserted into the reactor 200. Such insertion and extraction can take place either manually, or by an automatic robot.

The foregoing arrangement makes the reactor 200 particularly well-suited for automated workpiece loading and unloading by, for example, a robotic transfer mechanism or the like. As evident from a comparison of FIGS. 7A and 8A, the spacing between the upper surface of the workpiece and the interior chamber wall of the upper chamber member 205 varies depending on whether the reactor 200 is in an open or closed state. When in the open state, the upper surface of the workpiece is spaced from the interior chamber wall of the upper chamber member 205 by a distance, x1, that provides sufficient clearance for operation of, for example, a workpiece transfer arm of a robotic transfer mechanism. When in the closed processing state, the upper surface of the workpiece is spaced from the interior chamber wall of the upper chamber member 205 by a distance, x2, that is less than the distance, x1. The distance, x2, in the disclosed embodiment may be chosen to correspond to the spacing that is desired during workpiece processing operations.

Figure 9:
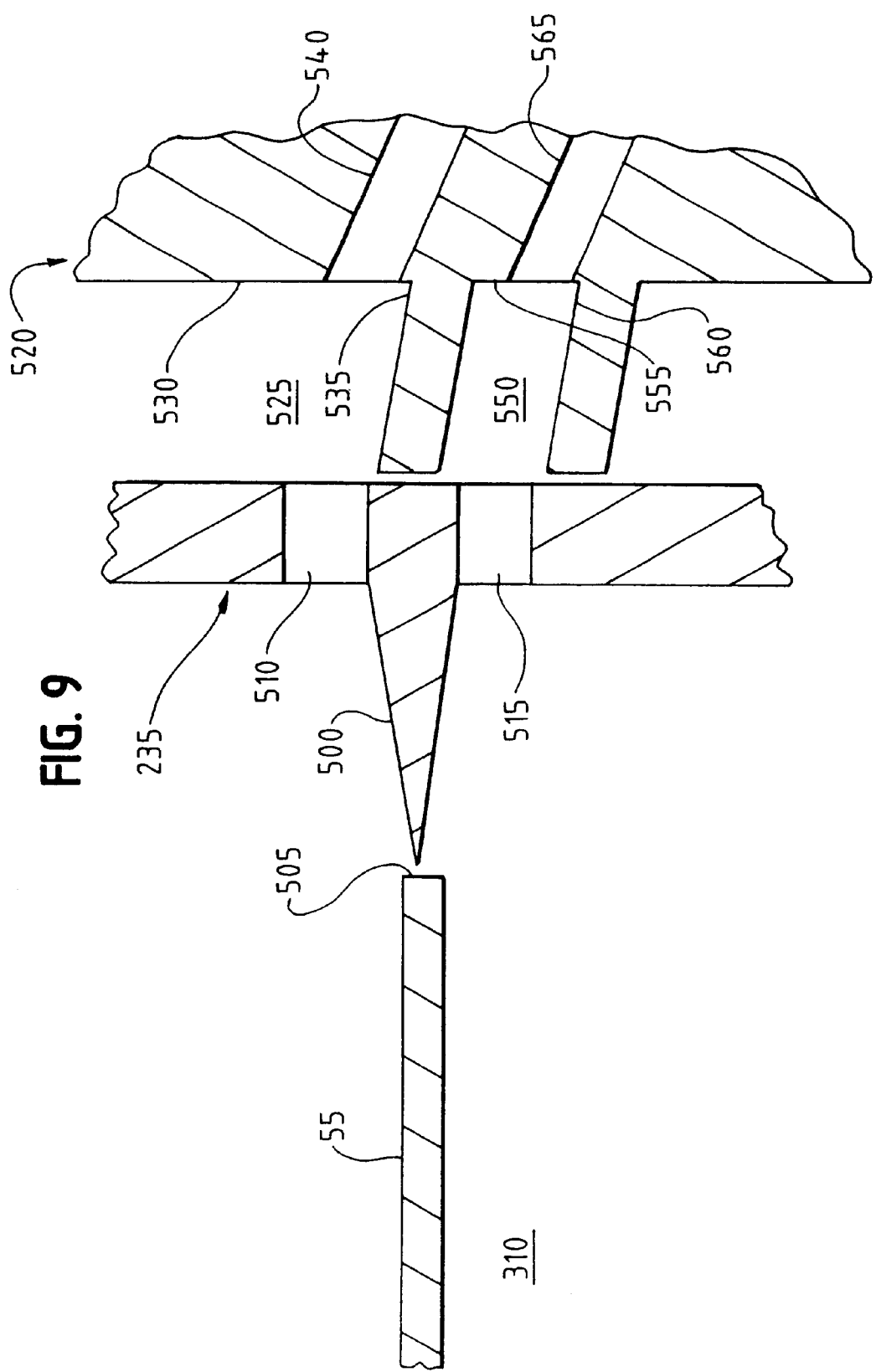
FIG. 9 illustrates one embodiment of an edge configuration that facilitates mutually exclusive processing of the upper and lower wafer surfaces in the workpiece housing.

FIG. 9 illustrates an edge configuration that facilitates separate processing of each side of the wafer 55. As illustrated, a dividing member 500 extends from the sidewall 235 of the processing chamber 310 to a position immediately proximate the peripheral edge 505 of the wafer 55. The dividing member 500 may take on a variety of shapes, the illustrated tapered shape being merely one configuration. The dividing member 500 preferably extends about the entire circumference of the chamber 310. A first set of one or more outlets 510 is disposed above the dividing member 500 to receive spent processing fluid from the upper surface of the wafer 55. Similarly, a second set of one or more outlets 515 is disposed below the dividing member 500 to receive spent processing fluid from the lower surface of the wafer 55. When the wafer 55 rotates during processing, the fluid through supply 415 is provided to the upper surface of the wafer 55 and spreads across the surface through the action of centripetal acceleration. Similarly, the fluid from supply tube 125 is provided to the lower surface of the wafer 55 and spreads across the surface through the action of centripetal acceleration. Because the edge of the dividing member 500 is so close to the peripheral edge of the wafer 55, processing fluid from the upper surface of the wafer 55 does not proceed below the dividing member 500, and processing fluid from the lower surface of the wafer 55 does not proceed above the dividing member 500. As such, this reactor construction makes it possible to concurrently process both the upper and lower surfaces of the wafer 55 in a mutually exclusive manner using different processing fluids and steps.

FIG. 9 also illustrates one manner in which the processing fluids supplied to the upper and lower wafer surfaces may be collected in a mutually exclusive manner. As shown, a fluid collector 520 is disposed about the exterior periphery of the reactor 200. The fluid collector 520 includes a first collection region 525 having a splatter stop 530 and a fluid trench 535 that is structured to guide fluid flung from the outlets 510 to a first drain 540 where the spent fluid from the upper wafer surface may be directed to a collection reservoir for disposal or re-circulation. The fluid collector 520 further includes a second collection region 550 having a further splatter stop 555 and a further fluid trench 560 that is structured to guide fluid flung from the outlets 515 to a second drain 565 where the spent fluid from the lower wafer surface may be directed to a collection reservoir for disposal or re-circulation.

Figure 10:
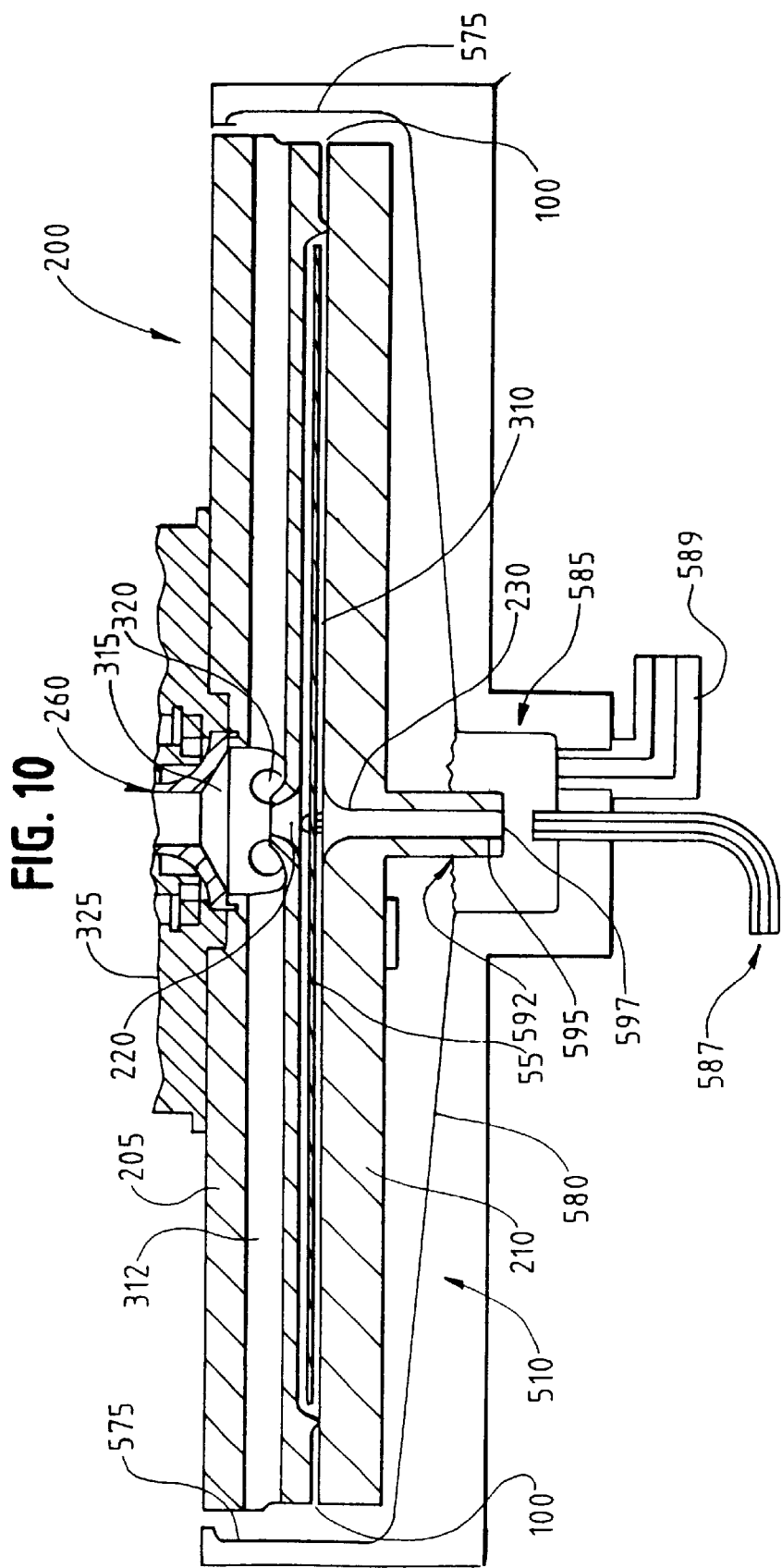
FIG. 10 illustrates an embodiment of the workpiece housing employed in connection with a self-pumping re-circulation system.

FIG. 10 illustrates an embodiment of the reactor 200 having an alternate configuration for supplying processing fluid through the fluid inlet opening 230. As shown, the workpiece housing 20 is disposed in a cup 570. The cup 570 includes sidewalls 575 exterior to the outlets 100 to collect fluid as it exits the chamber 310. An angled bottom surface 580 directs the collected fluid to a sump 585. Fluid supply line 587 is connected to provide an amount of fluid to the sump 585. The sump 585 is also preferably provided with a drain valve 589. An inlet stem 592 defines a channel 595 that includes a first end having an opening 597 that opens to the sump 585 at one end thereof and a second end that opens to the inlet opening 230.

In operation of the embodiment shown in FIG. 10, processing fluid is provided through supply line 587 to the sump 585 while the reactor 200 is spinning. Once the sump 585 is full, the fluid flow to the sump through supply line 587 is eliminated. Centripetal acceleration resulting from the spinning of the reactor 200 provides a pressure differential that drives the fluid through openings 597 and 230, into chamber 310 to contact at least the lower surface of the wafer 55, and exit outlets 100 where the fluid is re-circulated to the sump 585 for further use.

There are numerous advantages to the self-pumping re-circulation system illustrated in FIG. 10. The tight fluid loop minimizes lags in process parameter control thereby making it easier to control such physical parameters as fluid temperature, fluid flow, etc. Further, there is no heat loss to plumbing, tank walls, pumps, etc. Still further, the system does not use a separate pump, thereby eliminating pump failures which are common when pumping hot, aggressive chemistries.

FIGS. 11 and 12 illustrate two different types of processing tools, each of which may employ one or more processing stations including the reactor constructions described above. FIG. 11 is a schematic block diagram of a tool, shown generally at 600, including a plurality of processing stations 605 disposed about an arcuate path 606. The processing stations 605 may all perform similar processing operations on the wafer, or may perform different but complementary processing operations. For example, one or more of the processing stations 605 may execute an electrodeposition process of a metal, such as copper, on the wafer, while one or more of the other processing stations perform complementary processes such as, for example, clean/dry processing, pre-wetting processes, photoresist processes, etc.

Wafers that are to be processed are supplied to the tool 600 at an input/output station 607. The wafers may be supplied to the tool 600 in, for example, S.M.I.F. pods, each having a plurality of the wafers disposed therein. Alternatively, the wafers may be presented to the tool 600 in individual workpiece housings, such as at 20 of FIG. 1.

Each of the processing stations 605 may be accessed by a robotic arm 610. The robotic arm 610 transports the workpiece housings, or individual wafers, to and from the input/output station 607. The robotic arm 610 also transports the wafers or housings between the various processing stations 605.

In the embodiment of FIG. 11, the robotic arm 610 rotates about axis 615 to perform the transport operations along path 606. In contrast, the tool shown generally at 620 of the FIG. 12 utilizes one or more robotic arms 625 that travel along a linear path 630 to perform the required transport operations. As in the embodiment of FIG. 10, a plurality of individual processing stations 605 are used, but more processing stations 605 may be provided in a single processing tool in this arrangement.

FIG. 13 illustrates one manner of employing a plurality of workpiece housings 700, such as those described above, in a batch processing apparatus 702. As shown, the workpiece housings 700 are stacked vertically with respect to one another and are attached for rotation by a common rotor motor 704 about a common rotation axis 706. The apparatus 702 further includes a process fluid delivery system 708. The delivery system 708 includes a stationary manifold 710 that accepts processing fluid from a fluid supply (not shown). The stationary manifold 710 has an outlet end connected to the input of a rotating manifold 712. The rotating manifold 712 is secured for co-rotation with the housings 700 and, therefore, is connected to the stationary manifold 710 at a rotating joint 714. A plurality of fluid supply lines 716 extend from the rotating manifold 712 and terminate at respective nozzle portions 718 proximate inlets of the housings 700. Nozzle portions 718 that are disposed between two housings 700 are constructed to provide fluid streams that are directed in both the upward and downward directions. In contrast, the lowermost supply line 716 includes a nozzle portion 718 that directs a fluid stream only in the upward direction. The uppermost portion of the rotating manifold 712 includes an outlet 720 that provides processing fluid to the fluid inlet of the uppermost housing 700.

The batch processing apparatus 702 of FIG. 13 is constructed to concurrently supply the same fluid to both the upper and lower inlets of each housing 700. However, other configurations may also be employed. For example, nozzle portions 718 may include valve members that selectively open and close depending on whether the fluid is to be supplied through the upper and/or lower inlets of each housing 700. In such instances, it may be desirable to employ an edge configuration, such as the one shown in FIG. 9, in each of the housings 700 to provide isolation of the fluids supplied to the upper and lower surfaces of the wafers 55. Still further, the apparatus 702 may include concentric manifolds for supplying two different fluids concurrently to individual supply lines respectively associated with the upper and lower inlets of the housings 700.

An embodiment of the reactor that is particularly well-suited for integration in an automated processing tool is illustrated in FIG. 14. The reactor, shown generally at 800, includes features that cooperate in a unique manner to allow a robotic arm or the like to insert and extract a workpiece to and from the reactor 800 during loading and unloading operations while also maintaining relatively tight clearances between the workpiece and the interior chamber walls of the reactor during processing.

Figure 15:
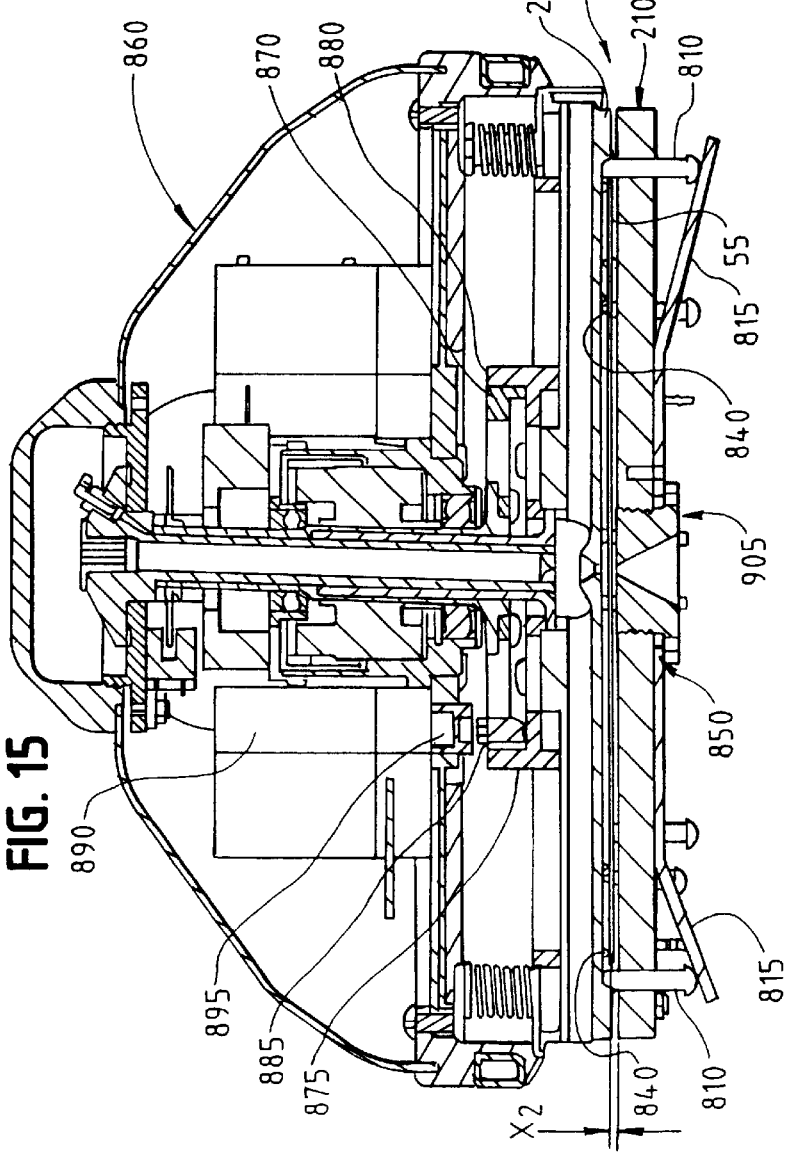
FIG. 15 illustrates the embodiment of the reactor of FIG. 14 wherein the reactor is in a closed processing state.

One of the principal differences between the reactor embodiments described above and the reactor 800 of FIG. 14 lies in the nature of the workpiece support assembly. As shown, reactor 800 includes a workpiece support assembly associated with the lower chamber member 210. The workpiece support assembly includes a plurality of workpiece support members 810 that extend through the lower chamber member 210. The workpiece support members 810 are supported at a lower end thereof by a biasing member 815. At the upper end of each, the workpiece support member 810 has a workpiece support surface 820 and a guide structure 825. Referring to FIG. 15, the guide structure 825 extends from the workpiece support surface 820 and terminates at a frustoconical section 830. The guide structure 825 assists in urging the peripheral edges of the workpiece into proper alignment with the workpiece support surface 820 thereby ensuring proper registration of the workpiece during processing. The guide structure 825 may also serve as a spacer that defines the clearance between the interior chamber wall of the upper chamber member 205 and the upper surface of the workpiece.

The biasing member 815 of the illustrated embodiment serves to bias the workpiece support members 810 in an upward direction when the upper and lower chamber members 205 and 210 are in the illustrated open condition in which the reactor 800 is ready for loading or unloading the workpiece. The biasing member 815 may take on various forms. For example, a single biasing structure may be used that is common to all of the workpiece support members 810. Alternatively, as shown in the disclosed embodiment, individual biasing structures may be respectively associated with individual ones of the workpiece support members 810. The individual biasing structures are in the form of leaf springs 835 but, for example, may alternatively be in the form of coil spring actuators or the like.

As in the embodiment of the reactor described above, the upper and lower chamber members 205 and 210 of reactor 800 are movable with respect to one another between the open condition of FIG. 14 to a closed processing condition as illustrated in FIG. 15. As the chamber members 205 and 210 move toward one another, the frustoconical sections 830 of the workpiece support members 810 engage the interior chamber wall of the upper chamber member 205. Continued movement between the chamber members 205 and 210 drives the workpiece support members 810 against the leaf springs 835 until the workpiece is clamped between the support surfaces 820 of the workpiece support members 810 and corresponding projections 840 that extend from the interior chamber wall of the upper chamber member 205. While in this closed state, the reactor is ready to process the workpiece.

The reactor 800 of FIG. 14 also includes structures which assists in ensuring proper registration between the upper and a lower chamber members 210 and 205 as they are brought proximate one another to their processing position. In the illustrated embodiment, these structures are in the form of lead-in pins 845 that extend from one of the chamber members to engage corresponding apertures of the other of the chamber members. Here, the lead-in pins 845 extend from the lower chamber member 210 to engage corresponding apertures (not shown) in the upper chamber member 205. The lead-in pins. 845 are in the form of upstanding members that each terminate in a respective frustoconical section that functions as a guide surface.

The foregoing arrangement makes the reactor 800 particularly well-suited for automated workpiece loading and unloading by, for example, a robotic transfer mechanism or the like, particularly one in which the workpiece is directly inserted into the reactor without flipping of the workpiece. As evident from a comparison of FIGS. 14 and 15, the spacing between the lower surface of the workpiece and the interior chamber wall of the lower chamber member 210 varies depending on whether the reactor 800 is in an open or closed state. When in the open state, the lower surface of the workpiece is spaced from the interior chamber wall of the lower chamber member 210 by a distance, x1, that provides sufficient clearance for operation of, for example, a workpiece transfer arm of a robotic transfer mechanism. When in the closed processing state, the lower surface of the workpiece is spaced from the interior chamber wall of the lower chamber member 210 by a distance, x2, that is less than the distance, x1. The distance, x2, in the disclosed embodiment corresponds to the spacing that is desired during workpiece processing operations.

Figure 16:
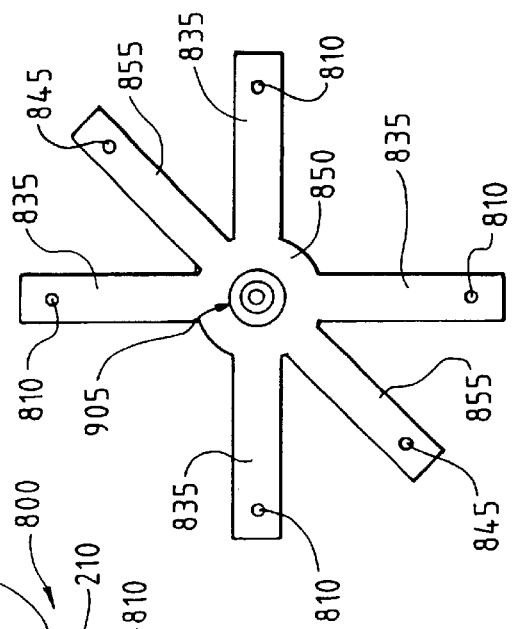
FIG. 16 illustrates one embodiment of a biasing member that may be used in the reactor of FIG. 14.

One embodiment of the biasing member 815 is illustrated in FIG. 16. As shown, the biasing member 815 is comprised of a plurality of leaf springs 835 that extend radially from a central hub portion 850 to positions in which they contact the underside of respective workpiece support members 810. A further plurality of radial members 855 extend from the hub 850 to positions in which they contact the underside of respective lead-in pins 845. Unlike the leaf springs 835, the further plurality of radial members 855 are not necessarily designed to flex as the upper and lower chamber members 210 and 205 move toward the processing position. The biasing member 825 may be formed from a polymer material or the like which is resistant to the chemistry used in the processing environment. When formed from such a material, the workpiece support members 810 and lead-in pins 845 may be formed integral with their respective leaf springs 835 and radial members 855.

In the illustrated embodiment, the central hub portion 850 includes a central aperture 900 that accommodates a securement 905 which connects the biasing member 815 to the underside of the lower chamber member 210. With reference to FIGS. 14 and 15, the securement 905 can be formed to provide the processing fluid inlet through the lower chamber member 210. When the securement 905 is formed in this manner, the reactor 800 is provided with a quick and easy manner of providing different inlet configurations for different processes.

On occasion, it may be desirable to remove the reactor 800 from head portion 860. For example, the reactor 800 may be removed for service or for replacement with a reactor that is designed for executing other processes, or processing other workpiece types.

As shown in FIG. 14, the reactor 800 and the head portion 860 are engaged at a connection hub assembly 865 which allows the reactor 800 to be easily connected to and disconnected from the head portion 860. In embodiment illustrated in FIG. 15, the connection hub assembly 865 is comprised of a head connection hub 870 that is fixed to the processing head portion 860, and a reactor connection hub 875 that is fixed to the reactor 80. The connection hubs 870 and 875 are secured to one another during normal operation by, for example, a threaded joint 880. A set screw 885 extends through the head connection hub 870 and may be rotated to engage a surface of or corresponding aperture in the reactor connection hub 875 to thereby prevents the connection hubs 870 and 875 from unscrewing.

When removal of the reactor 800 is desired, the reactor is rotated to align set screw 885 with a corresponding channel sleeve 890 that is fixed to the head portion 860. The channel sleeve 890 is constructed to allow a user to extend a tool therethrough to engage the set screw 885. The set screw is then turned to raise it until it engages and secures with a screw head block 895. Once secured in this manner, the head connection hub 870 is rotationally locked with the head portion 860 thereby allowing the reactor 800 and corresponding reactor connection hub 875 to be unscrewed from the head connection hub 870 to remove the reactor.

In accordance with a still further feature of the reactor 800, a stiffening member 910 formed, for example, from aluminum is secured with the upper chamber member 205. By increasing the stiffness of the upper and/or lower chamber members, higher rotating speeds may be used and, further, the flatness of the interior chamber walls during processing may be increased.

Numerous substantial benefits flow from the use of the disclosed reactor configurations. Many of these benefits arise directly from the reduced fluid flow areas in the reactor chambers. Generally, there is a more efficient use of the processing fluids since very little of the fluids are wasted. Further, it is often easier to control the physical parameters of the fluid flow, such as temperature, mass flow, etc., using the reduced fluid flow areas of the reactor chambers. This gives rise to more consistent results and makes those results repeatable.

The foregoing constructions also give rise to the ability to perform sequential processing of a single wafer using two or more processing fluids sequentially provided through a single inlet of the reaction chamber. Still further, the ability to concurrently provide different fluids to the upper and lower surfaces of the wafer opens the opportunity to implement novel processing operations. For example, a processing fluid, such as HF liquid, may be supplied to a lower fluid inlet of the reaction chamber for processing the lower wafer surface while an inert fluid, such as nitrogen gas, may be provided to the upper fluid inlet. As such, the HF liquid is allowed to react with the lower surface of the wafer while the upper surface of the wafer is effectively isolated from HF reactions. Numerous other novel processes may also be implemented.

Further, wafers may be rinsed and dried on an individual basis more quickly when compared to the drying of an individual wafer using any of the foregoing processes.

FIG. 17 illustrates one manner of controlling the provision of rinsing/drying fluids that are supplied to the rinser/dryer of any of the foregoing embodiments. As illustrated, the fluid supply system, shown generally at 1800, includes a nitrogen gas supply 1805, an IPA supply 1810, an IPA vaporizer 1815, a DI water supply 1820, optional heating elements 1825, optional flowmeters 1830, optional flow regulators/temperature sensors 1835, and valve mechanism 1840. All of the various components of the system 1800 may be under the control of a controller unit 845 having the appropriate software programming.

In operation of the rinser/dryer, the valve mechanism 1840 is connected to supply DI water from supply 1820 to both the upper and lower inlets of the rinser/dryer chamber. As the water is supplied to the chamber, the wafer is spun at, for example, a rate of 200 RPM. This causes the water to flow across each surface of the wafer under the action of centripetal acceleration. Once a sufficient amount of water has been supplied to the chamber to rinse the wafer surfaces, valve mechanism 1840 is operated to provide a drying fluid, preferably comprised of nitrogen and IPA vapor, to both the upper and lower inlets of the rinser/dryer chamber. Valve mechanism 1840 is preferably operated so that the front of the drying fluid immediately follows the trailing end of the DI water. As the drying fluid enters the chamber, centripetal acceleration resulting from the spinning of the wafer drives the drying fluid across the wafer surface and follows a meniscus across the wafer surface formed by the DI water. The IPA vapor assists in providing a drying of the surface of the wafer at the edge of the meniscus. Drying of the wafer may be further enhanced by heating the DI water and/or the nitrogen/IPA vapor using heating elements 1825. The particular temperature at which these fluids are supplied may be controlled by the controller 1845. Similarly, flow regulators 1835 and flowmeters 1830 may be used by controller 1845 to regulate the flow of the DI water and/or the nitrogen/IPA vapor to the rinser/dryer chamber.

With some modifications, the foregoing reactor designs may be adapted to execute several unique processes in which contact between the microelectronic workpiece and one or more processing fluids is controlled and confined to selected areas of the workpiece. One embodiment of such a reactor design is shown in FIGS. 18–22.

With reference to FIGS. 18–22, there is shown a reactor 2100 for processing a microelectronic workpiece, such as a silicon wafer 55 having an upper side 12, a lower side 14, and an outer, circular perimeter 16, in a micro-environment. For certain applications, the upper side 12 is the front side, which may be otherwise called the device side, and the lower side 14 is the back side, which may be otherwise called the non-device side. However, for other applications, the silicon wafer 55 is inverted.

Generally, except as disclosed herein, the reactor 2100 is similar to the reactors illustrated and described above. However, as illustrated in the drawings and described herein, the reactor 2100 is improved to be more versatile in executing selected microelectronic fabrication processes.

The reactor 2100 has an upper chamber member or rotor that includes an upper or chamber wall 2120 and a lower chamber member or rotor that includes a lower chamber wall 2140. These walls 2120, 2140, are arranged to open so as to permit a wafer 55 to be loaded into the reactor 2100 for processing, by a loading and unloading mechanism (not shown) that, for example, may be in the form of a robot having an end effector. These walls 2120, 2140, are arranged to close so as to define a capsule 2160 supporting a wafer 55 in a processing position, between these walls 2120, 2140.

The reactor 2100, which defines a rotation axis A, has a head 2200 containing a rotor 2210, which mounts the upper chamber wall 2120, and mounting a motor 2220 for rotating the rotor 2210 and the upper and lower chamber walls 2120, 2140, when closed, around the axis A, conjointly with a wafer 55 supported in the processing position. The motor 2220 is arranged to drive a sleeve 2222, which is supported radially in the head 2200, by rolling-element bearings 2224. The head 2200 is arranged to be raised for opening these walls 2120, 2140, and to be lowered for closing these walls 2120, 2140.

The upper chamber wall 2120 has an inlet 2122 for processing fluids, which may be liquid, vaporous, or gaseous, and the lower chamber wall 2140 has an inlet 2142 for such fluids, which for a given application may be similar fluids or different fluids. The head 2200 mounts an upper nozzle 2210, which extends axially through the sleeve 2222 so as not to interfere with the rotation of the sleeve 2222. The upper nozzle 2210 directs streams of processing fluids downwardly through the inlet 2122 of the upper chamber wall 2120.

The upper chamber wall 2120 includes an array of similar outlets 2124, which are spaced similarly at uniform angular spacings around the vertical axis A. In the disclosed embodiment, thirty-six such outlets 2124 are employed. The outlets 2124 are spaced outwardly from the vertical axis A by just slightly less than the workpiece radius. The outlets 2124 are also spaced inwardly from the outer perimeter 16 of a wafer 55 supported in the processing position by a much smaller radial distance, such as a distance of approximately 1–5 mm.

When the upper and lower rotors are closed together, the chamber walls 2120, 2140 define a micro-environment reactor 2160 the having an upper processing chamber 2126 that is defined by the upper chamber wall 2120 and by a first generally planar surface of the supported wafer 55, and a lower processing chamber 2146 that is defined by the lower chamber wall 2140 and a second generally planar surface of the supported wafer opposite the first side. The upper and lower processing chambers 2126, 2146, are in fluid communication with each other in an annular region 2130 beyond the outer perimeter 16 of the supported wafer 55 and are sealed by an annular, compressible seal (e.g. O-ring) 2132 bounding a lower portion 2134 of the annular region 2130. The seal 2132 allows processing fluids entering the lower inlet 2142 to remain under sufficient pressure to flow toward the outlets 2124.

As compared to reactors of the type disclosed in the previously described embodiments, the reactor 2100 is particularly suitable for executing a range of unique microfabrication processes. For example, reactor 2100 is particularly suited to execute a process that requires complete contact of a processing fluid at a first side of a workpiece and at only a perimeter margin portion of the second side thereof. Such processes may be realized because processing fluids entering the inlet 2142 of the lower chamber wall 2140 can act on the lower side 14 of a supported wafer 55, on the outer perimeter 16 of the supported wafer 55, and on an outer margin 18 of the upper side 12 of the supported wafer 55 before reaching the outlets 2124, and because processing fluids entering the inlet 2122 of the upper chamber wall 2120 can act on the upper side 12 of the supported wafer 55, except for the outer margin 18 of the upper side 12, before reaching the outlets 2124.

As a significant example of one such process, the reactor 2100 can be used with control of the respective pressures of processing fluids entering the respective inlets 2122, 2142, to carry out a process in which a processing fluid is allowed to contact a first side of the workpiece, the peripheral edge of the workpiece, and a peripheral region of the opposite side of the workpiece. Such fluid flow/contact can also be viewed as a manner of excluding a processing fluid that is applied to the opposite side from a peripheral region of that side. In accordance with one embodiment of such a process, a thin film of material is etched from the first side, peripheral edge of the workpiece, and peripheral region of the opposite side of the workpiece.

In a more specific embodiment of such a process, the process may employed in a metallization process that is used to form a microelectronic component and/or interconnect structures on a semiconductor wafer or the like. To this end, a thin film, such as the seed layer, is applied over a barrier layer on the front side and over at least a portion of the outer perimeter. After one or more intervening steps, such as electroplating of a copper layer or the like thereover, an etchant capable of etching the electroplating material, thin film material, and/or the barrier layer material is caused to flow selectively over only an outer margin of the first side while being concurrently prevented from flowing over other radial interior portions of the first side. Thus, one or more of the layers are removed from the outer margin of the first side while the layers remain intact at the portions of the first side that are disposed interior of the outer margin. If the etchant is driven over the opposite side and over the outer perimeter, as well as over the outer margin of the first side, the one or more layers are also removed from the outer perimeter of the wafer and, further, any contaminant that the etchant is capable of removing is stripped from the back side.

Based on the description of the foregoing process, it will be recognized that other layers and/or materials may be selectively etched, cleaned, deposited, protected, etc., based on selective contact of a processing fluid with the outer margin and/or opposing side of the workpiece. For example, oxide may be removed from the opposite side and outer margin of the first side of a workpiece through selective contact with an oxide etchant, such as hydrofluoric acid. Similarly, the oxide etchant may be controlled in the reactor so that it contacts all of the front side of the workpiece except for the outer margin thereby leaving the oxide at the outer margin intact. It will also be recognized that removal of the outlets 2124 allows the reactor 2100 to be used for processes in which selective outer margin inclusion or exclusion is unnecessary or otherwise undesirable.

Figure 19:
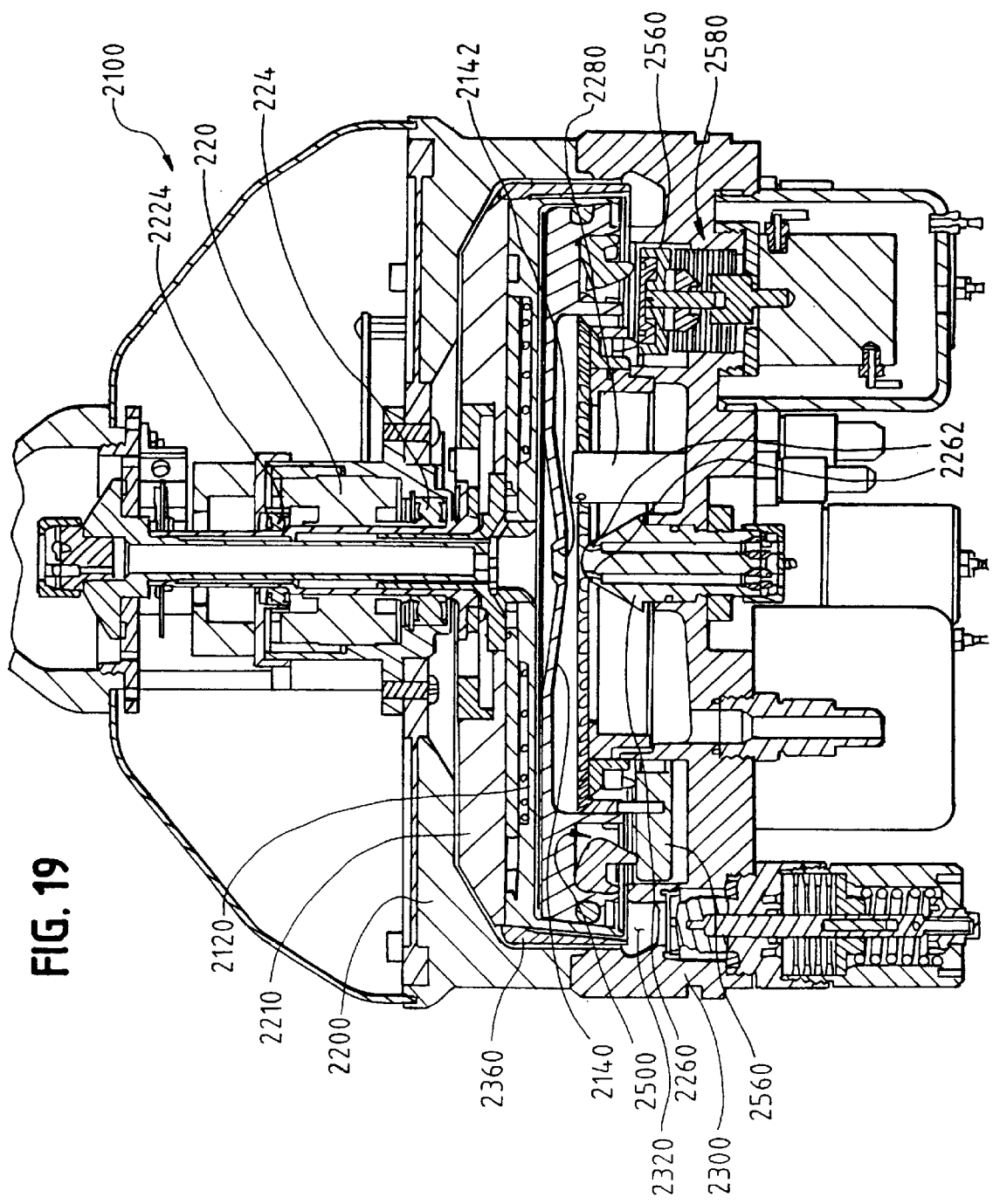
FIG. 19 is a section view of the reactor shown in FIG. 18.

As illustrated in FIGS. 19–20, additional structures may be incorporated with any of the foregoing reactors dependent on the particular process(es) the reactor is designed to implement and the automation, if any, that will be used along with it. In accordance with one such structural addition, the lower chamber wall 2140 has an upper surface 2144 shaped so as to define an annular sump 2146 around the inlet 2142. The sump 2146 is used to collect liquid byproducts and/or residual processing fluids supplied through the inlet 2142. If a liquid, for example, strikes and drops from wafer 55, it is conducted toward the outlet 2124 under the influence of centripetal acceleration as the reactor 100 is rotated.

Another structural addition illustrated in connection with the reactor 2100 relates to the lower nozzle design. As illustrated, the lower nozzle 2260, which is provided beneath the inlet 2142 of the lower chamber wall 2140, includes two or more ports 2262, as shown in FIG. 19, for directing two or more streams of processing fluids upwardly through the inlet 2142. The ports 2262 are oriented so as to cause the directed streams to converge approximately where the directed streams reach the lower surface of the wafer 55. The reactor 2100 also includes a purging nozzle 2280, which is disposed at a side of the lower nozzle 2260, for directing a stream of purging gas, such as nitrogen, across the lower nozzle 2260.

Still further, the reactor 2100 may have a base 2300, which mounts the lower nozzle 2260 and the purging nozzle 2280 and which defines a coaxial, annular plenum 2320. The plenum 2320 has plural (e.g. four) drains 2322 (one shown) each of which is equipped with a pneumatically actuated, poppet valve 2340 for opening and closing the drain 2322. These drains 2322 provide separate paths for conducting processing liquids of different types to appropriate systems (not shown) for storage, disposal, or recirculation.

An annular skirt 2360 extends around and downwardly from the upper chamber wall 2120, above the plenum 2320, so as to be conjointly rotatable with the upper chamber wall 2140. Each outlet 2124 is oriented so as to direct processing fluids exiting such outlet 2124 through fluid passages 2364 against an inner surface 2362 of the annular skirt 2360. The inner surface 2362 is flared outwardly and downwardly, as shown, so as to cause processing fluids reaching the inner surface 2362 to flow outwardly and downwardly toward the plenum 2320, under the influence of centripetal acceleration when the reactor is rotated. Thus, processing. fluids tend to be swept through the plenum 2320, toward the drains 2322.

The rotor 2210 has a ribbed surface 2215 facing and closely spaced from a smooth lower surface of the head 2200, in an annular region 2204 communicating with the plenum 2320. When the rotor 2210 rotates, the ribbed surface 2215 tends to cause air in the annular region 2204 to swirl, so as to help to sweep processing fluids through the plenum 2320, toward the drains 2322.

The upper chamber wall 2120 has spacers 2128 that project downwardly to prevent the lifting of a supported wafer 55 from the processing position and from touching the upper chamber wall 2120. The lower chamber wall 2140 has spacers 2148 that project upwardly for spacing a supported wafer 55 above the lower chamber wall 140 by a given distance, and posts 2150 projecting upwardly beyond the outer perimeter 16 of a supported wafer 55 for preventing the supported wafer 55 from shifting off center from the vertical axis A.

Figure 24:
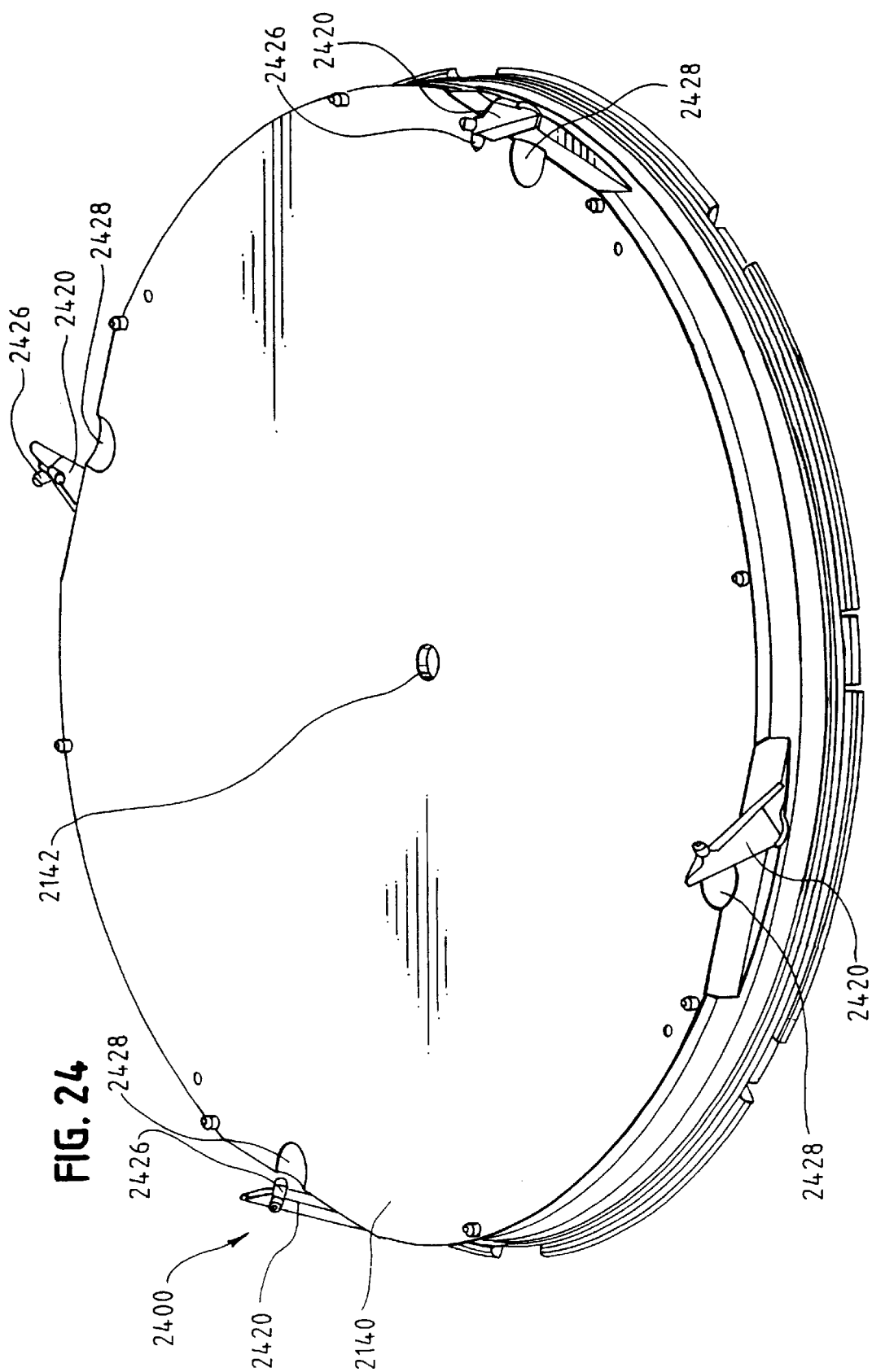
FIG. 24 is an enlarged, perspective view of an alternative lower chamber embodiment.

Referring to FIGS. 24–26, the lower chamber wall 2140 may mount a lifting mechanism 2400 for lifting a wafer 55 supported in the processing position to an elevated position. The lifting mechanism lifts the wafer 55 to the elevated position when the head 2200 is raised above the base 2300 so as to open the upper and lower chamber walls 2120, 2140. Lifting a supported wafer 55 to the elevated position facilitates its being unloaded by a loading and unloading mechanism (not shown) such as a robotic arm having an end effector.

The lifting mechanism 2400 includes an array of lifting levers 2420. Each lifting lever 2420 is mounted pivotably to the lower chamber wall 2140 via a pivot pin 2422 extending from such lifting lever 2420 into a socket 2424 in the lower chamber wall 2140, so as to be pivotable between an operative position and an inoperative position. Each pivoting lever 2420 is arranged to be engaged by the upper chamber wall 2120 when the upper and lower chamber walls 2120, 2140, are closed, whereby such pivoting lever 2420 is pivoted into the inoperative position. Each lifting lever 2420 is biased, as described below, so as to pivot into the operative position when not engaged by the upper chamber wall 2120.

Thus, each lifting lever 2420 is adapted to pivot from the operative position into the inoperative position as the upper and lower chamber walls 2120, 2140, are closed, and is adapted to pivot from the inoperative position into the operative position as the upper and lower chamber walls 2120, 2140, are opened. A pin 2424 on each lifting lever 2420 extends beneath a wafer 55 supported in the processing position and lifts the wafer to the elevated position, when such lifting lever 2420 is pivoted from the inoperative position into the operative position.

The lifting levers 2420 may be biased by an elastic member 2440 (e.g. O-ring) surrounding the lower chamber wall 2140 and engaging the lifting levers 2420, via a hook 2425 depending from each lifting lever 2420. On each lifting lever 2420, the pin 2422 defines an axis, relative to which the pin 2426 and the hook 2425 are opposed diametrically to the each other. The elastic member 2440 is maintained under comparatively higher tension when the upper and lower chamber walls 2120, 2140, are closed, and under comparatively lower tension when the upper and lower chamber walls 2120, 2140, are opened.

Figure 20A:
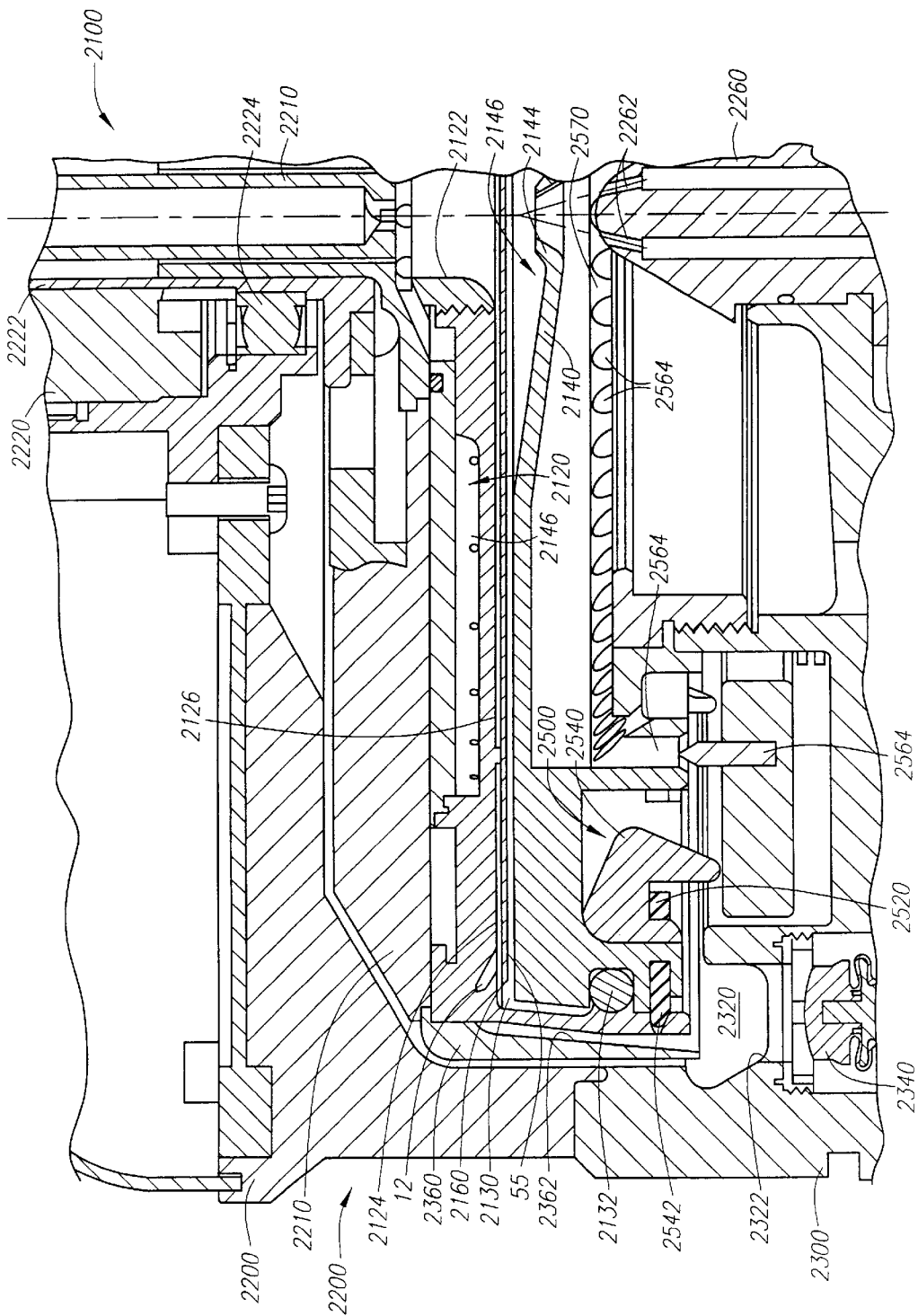
FIG. 20A is an enlarged detail of certain elements of the reactor of FIG. 18.
Figure 20B:
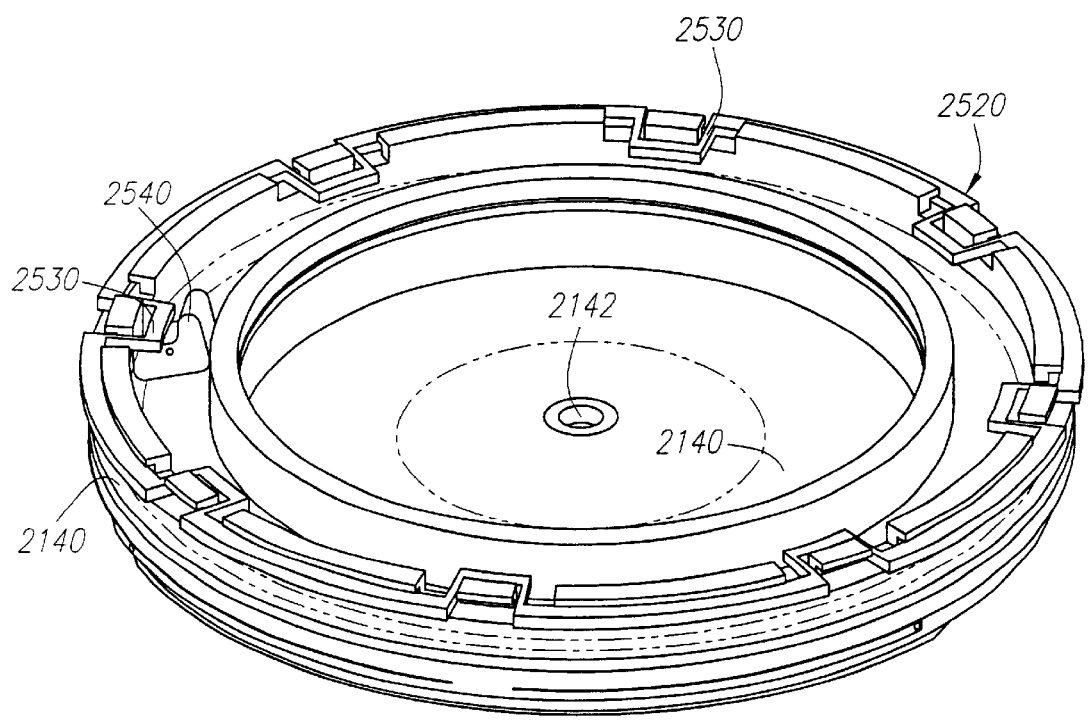
FIG. 20B is a bottom perspective view of the lower processing chamber shown in FIG. 19.
Figure 22:
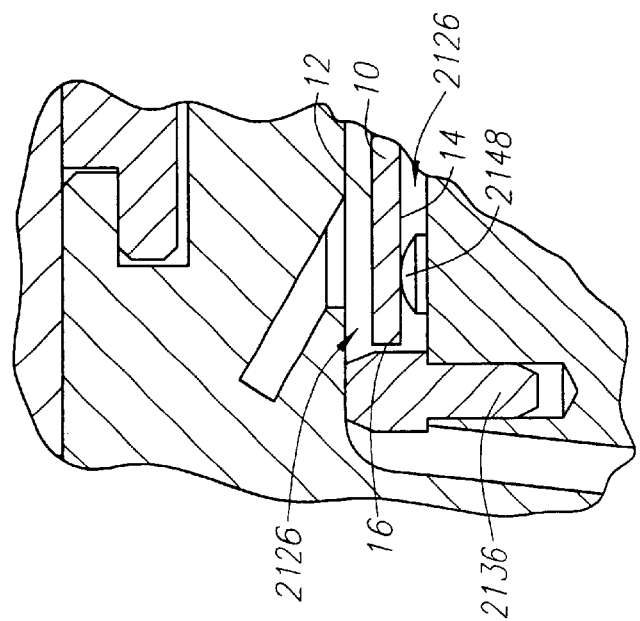
FIGS. 21 and 22 are further enlarged details of features shown in FIG. 20.
Figure 21:
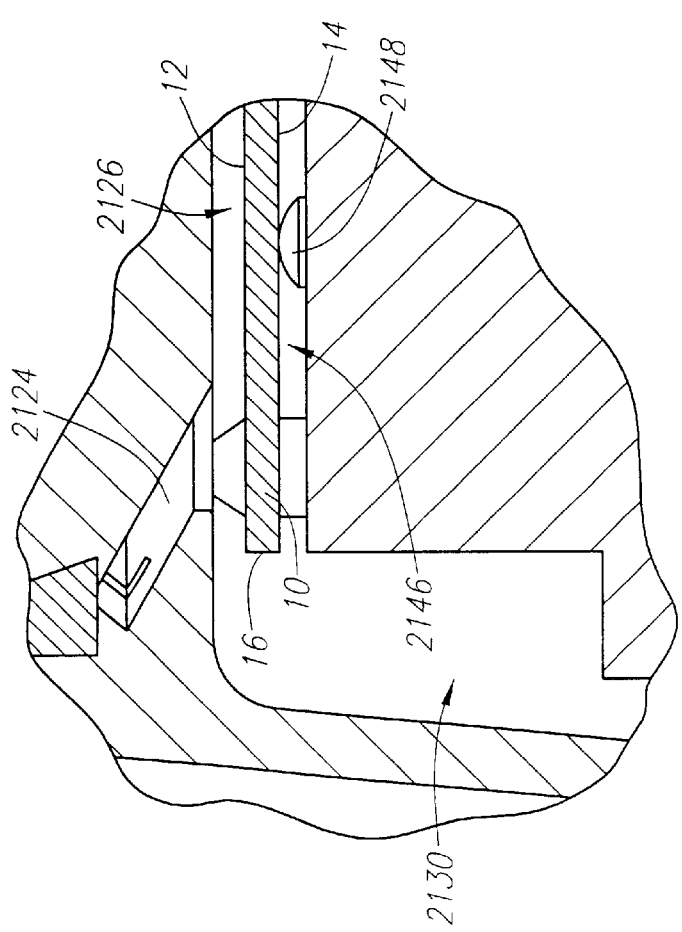
Figure 23:
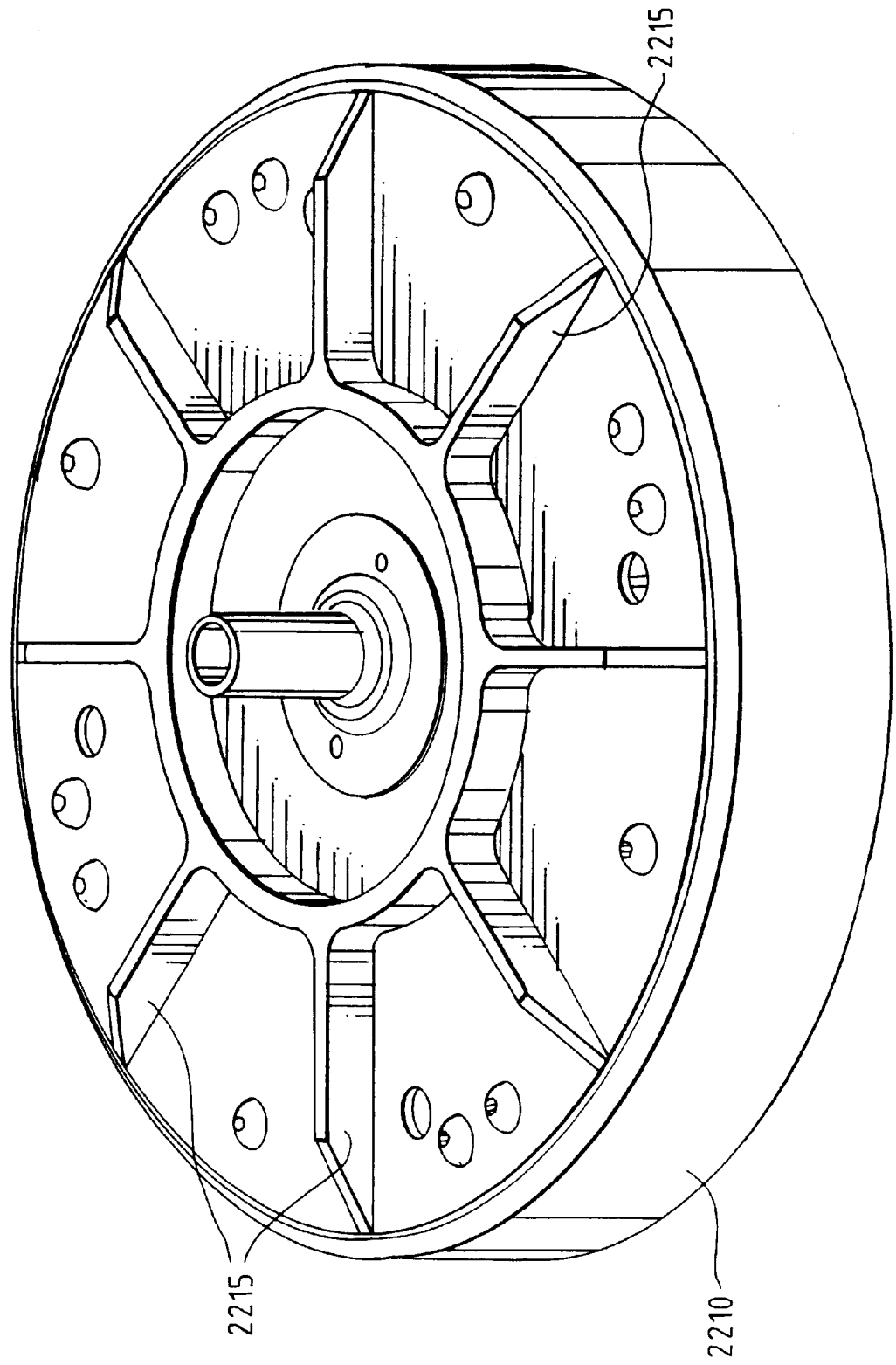
FIG. 23 is an enlarged, perspective view of a rotor, as used in the reactor of FIG. 18.

Referring momentarily to FIG. 20, the upper and lower chamber walls 2120, 2140, may also be releasably clamped to each other when in the closed state by a latching mechanism 2500. As shown in FIGS. 19, 20A and 20B, the latching mechanism includes a latching ring 2520 that is retained by the lower chamber wall 2140 and that is adapted to engage a complementary shaped recess 2540 disposed in the upper chamber wall 2120. The latching ring 2520 is made from a resilient spring material (e.g. polyvinylidine fluorid) with an array of inwardly stepped portions 2350 which allow the latching ring 2520 to deform from an undeformed condition in which the latching ring 2520 has a first diameter into a deformed condition in which the latching ring 2520 has a comparatively smaller diameter. Such deformation occurs when the stepped portions 2530 are subject to radial inward directed forces. Upon removal of the forces, the latching ring 2520 returns to the undeformed.

The latching mechanism 2500 further includes an array of latching cams 2540, each associated with a respective one of the stepped portions 2530. Each latching cam 2540 is adapted to apply radial forces to the respective stepped portions 2530.

As shown in FIG. 19, the latching mechanism 2500 further includes an actuating ring 2560, which is adapted to actuating the latching cams 2540 as the actuating ring 2560 is raised and lowered within a predetermined limited range of movement. The actuating ring 2560 is adapted, when raised, to actuate the latching cams 2540, and, when lowered, to deactuate the latching cams. Pneumatic lifters 2580 (e.g. three such devices) are adapted to raise and lower the actuating ring 2560. When the actuating ring 2560 is raised, the upper and lower chamber walls 2120, 2140, are released from each other so that the head 2200 can be raised from the base 2300 for opening the upper and lower chamber walls 2120, 2140, or lowered onto the base 2300 for closing the upper and lower chamber walls 2120, 2140.

As shown in FIG. 20A, pins 2562 (one shown) on the actuating ring 2560 project upwardly and into apertures 2564 in an aligning ring 2570, when the actuating ring 2560 is raised. The aligning ring 2570 is joined to, and rotates with, the lower chamber wall 2140. The pins 2562 are withdrawn from the apertures 2564 and clear the aligning ring 2570 when the actuating ring 2560 is lowered. When projecting into the respective apertures 2564, the pins 2562 align a wafer 55 that had been supported in the processing position so as to facilitate unloading the wafer 55 via a robotic system, as mentioned above.

FIGS. 27–30 show rotor edge configurations useful for processing an annular perimeter area, for carrying out process steps, as described above in connection with FIGS. 20–21.

Figure 27:
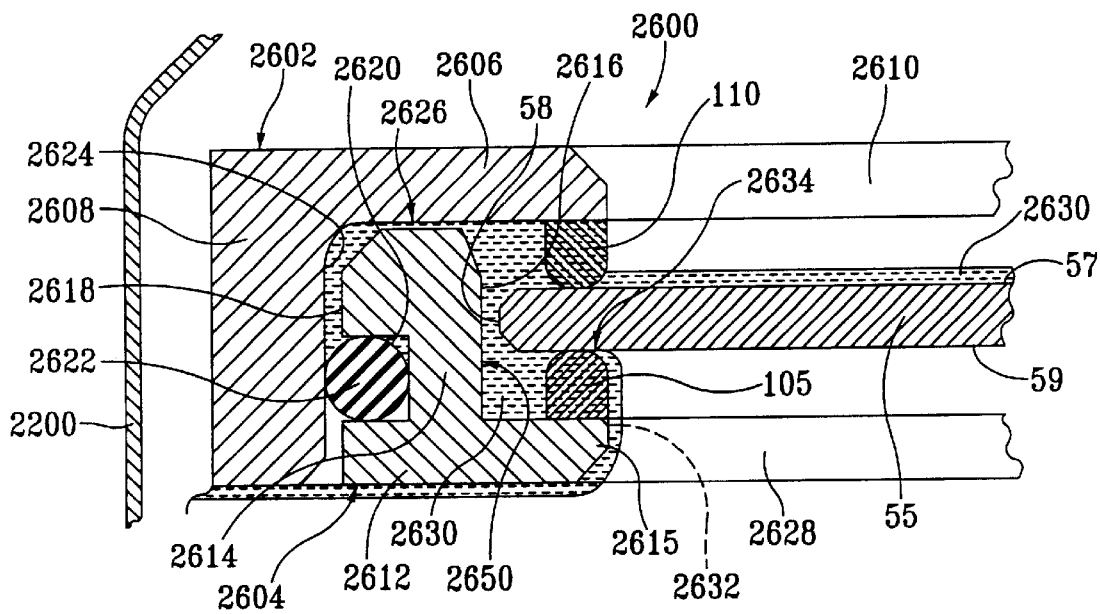
FIGS. 27, 29 and 30 are section views of alternative edge configurations.
Figure 28:
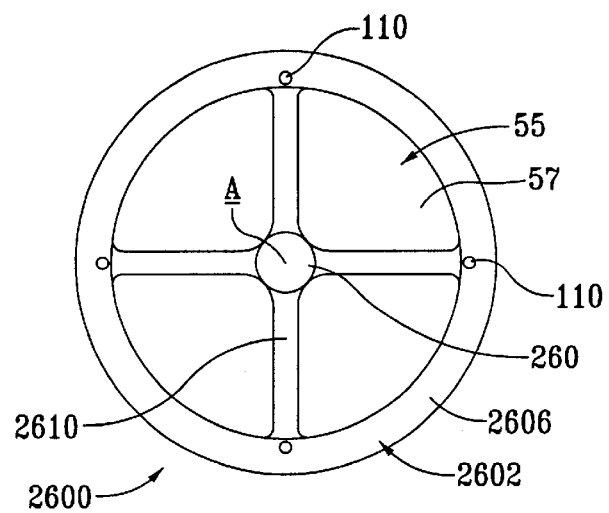
FIG. 28 is a top view of the rotor shown in FIG. 27.

Referring to FIGS. 27 and 28, in an alternative reactor embodiment 2600, an upper rotor 2602 has a top section 2606, joined to a side section 2608. The top section 2606 is joined to or integral with an upper web plate 2610, which in turn is joined to a shaft, such as the shaft 260 and drive motor described above.

A lower rotor 2604 has a vertical wall 2614 extending upwardly from a base section 2612. The vertical wall 2614 has an inner surface 2616 and an outer surface 2618. An o-ring groove 2620 in the outer surface 2618 contains an o-ring 2622, sealing the lower rotor 2604 against the inside surface 2624 of the side section 2608 of the upper rotor 2602, when the rotors are engaged together. The reactor 26 is rotatably mounted within a head 2200, or other enclosure.

A wafer 55 or other workpiece is supported at its perimeter by lower spacing members or pins 105 extending upwardly from the base section 2612 of the lower rotor 2604, and by upper spacing members or pins 110 extending downwardly from the top section 2606 of the upper rotor 2602. The end face or edge 58 of the wafer 55 is spaced slightly away from the inner surface 2616 of the vertical wall 2614. The pins 105 and 110 are of small diameter and have a minimum contact surface with the wafer 55. Accordingly, virtually the entire upper surface 57 and lower surface 59 of the wafer 55 is spaced apart from the structure of the reactor 2600.

Referring momentarily to FIG. 28, the upper and lower rotors 2602 and 2604 are substantially open, due to the weblike structure of the rotors. The pins 105 and 110, are radially spaced apart around the perimeter of the rotors.

In use, a processing fluid is applied to the top surface 57 of the wafer 55, preferably at a central area, as with the embodiments described above. The fluid 2630 flows radially outwardly over the top surface 57 and into a reservoir 2650 formed by the upper and lower rotors 2602 and 2604. Specifically, the reservoir 2650 is formed or defined on top by the top section 2606, on the bottom by the base section 2612, and on the outside by the inner surface 2616 of the vertical wall 2614. The inside surface of the reservoir 2650, i.e., the surface closest to the spin axis A, is open. Consequently, the reservoir 2650 is formed as a three-sided groove, having a top, bottom, and outside wall, but no inside wall.

In use, the upper and lower rotors are initially vertically spaced apart or separated. A wafer 55 or other workpiece is placed into the lower rotor 2604, either manually, or via a robot. The wafer rests on the lower spacing members or pins 105. The upper and lower rotors are then brought together. As this occurs, the wafer 55 is supported or held in place from above by the upper spacing member 110. Consequently, the wafer 55 is secured between the rotors. At the same time, the o-ring makes sliding contact with, and seals against, the upper rotor 2602.

The reactor 2600 is then accelerated up to a process spin speed. Processing fluid is introduced onto the upper surface 57 of the wafer 55. The fluid 2630 flows radially outwardly and into the reservoir 2650, via centrifugal force. Referring once again to FIG. 28, the pins 105 and 110 do not significantly obstruct the flow of the fluid 2630 into the reservoir 2650, as the reservoir 2650 extends completely circumferentially around the reactor 2600, while the pins occupy a very small area.

The reservoir 2650 fills with fluid 2630 running off of the wafer. The fluid is forced radially outwardly via centrifugal force, and thus it remains in the reservoir, and does not flow out of the open inner surface of the reservoir (i.e., the open side facing the spin axis A). Typically, a small gap 2626 remains between the upper rotor 2602 and the lower rotor 2604. Fluid may flow through this gap, is stopped when it reaches the o-ring 2622. With the reservoir 2650 filled, as additional fluid moves outwardly along the top surface 57 and into the reservoir, fluid is simultaneously displaced from the reservoir, as run-off 2632 over the inside lip or edge 2615 of the base section 2612 of the lower rotor 2604. The run-off 2632 runs down and then radially outwardly, and off of the rotors. The head or enclosure 2200 captures or deflects the run-off 2632.

With the spin speed and supply rate of fluid held approximately constant, a relatively sharply defined and consistent separation line 2634 is formed on the lower surface 59 of the wafer 55. Consequently, the entire upper surface 57, the outside edge 58, and an outside annular perimeter area, on the lower surface 59 (extending inwardly from the edge 58 to the separation line 2634), are covered with the fluid 2630, and consequently, are processed. The width of the annular perimeter area processed on the bottom surface 59, i.e., the dimension between the edge 58 and the separation line 2634, typically ranges from about 1–5 mm, and is usually about 3 mm. The entire central area of the lower surface 59, is not processed, as it is not contacted by the fluid.

Figure 29:
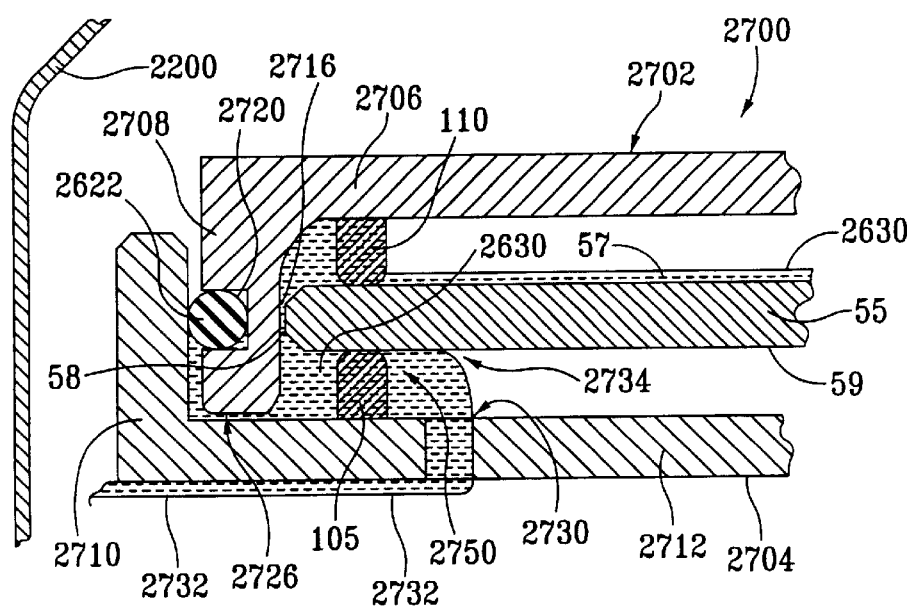

FIG. 29 discloses an alternative reactor design 2700 having an upper rotor 2702 and a lower rotor 2704. In contrast to the reactor 2600 shown in FIG. 27, the reactor 2700 in FIG. 29 has continuous disk or plate-like upper and lower rotors. Specifically, the upper rotor 2702 includes a side section or leg 2708 joined perpendicularly to a continuous round upper plate 2706. Similarly, the lower rotor 2704 includes an upright leg 2710 attached perpendicularly to a round and generally continuous lower rotor plate or disk 2712. With the upper and lower rotors engaged together, the side section 2708 of the upper rotor 2702 is sealed against the upright leg 2710 of the lower rotor 2704 via an o-ring 2622 in an o-ring groove 2720 in the side section 2708.

In use, the wafer 55 is supported between the rotors on supports or pins 105 and 110. The edge 58 of the wafer 55 is spaced slightly away from the inner surface 2716 of the side section 2708.

Processing fluid is introduced onto the top surface 57 of the wafer 55, while the reactor 2700 is spinning. The fluid flows radially outwardly into a reservoir 2750, similar to operation of the reactor 2600 as described above. Fluid flowing through any gap 2726 between the upper and lower rotors is stopped by the o-ring 2622. A drain hole 2730 is provided through the lower rotor 2704, at a location radially inwardly from the edge 58, typically by about 3 mm. The fluid 2630 flows out of the hole 2730, with the fluid run-off 2732 flowing out along the bottom surface of the lower rotor 2704, and then onto the head or enclosure 2200. The fluid flowing out of the hole 2730 forms a sharp circumferential separation line 2734. Consequently, the annular perimeter area of the lower surface 59 of the wafer 55 is processed, while the remaining (e.g., 194 mm diameter area of a 200 mm wafer) remains unprocessed.

Figure 30:
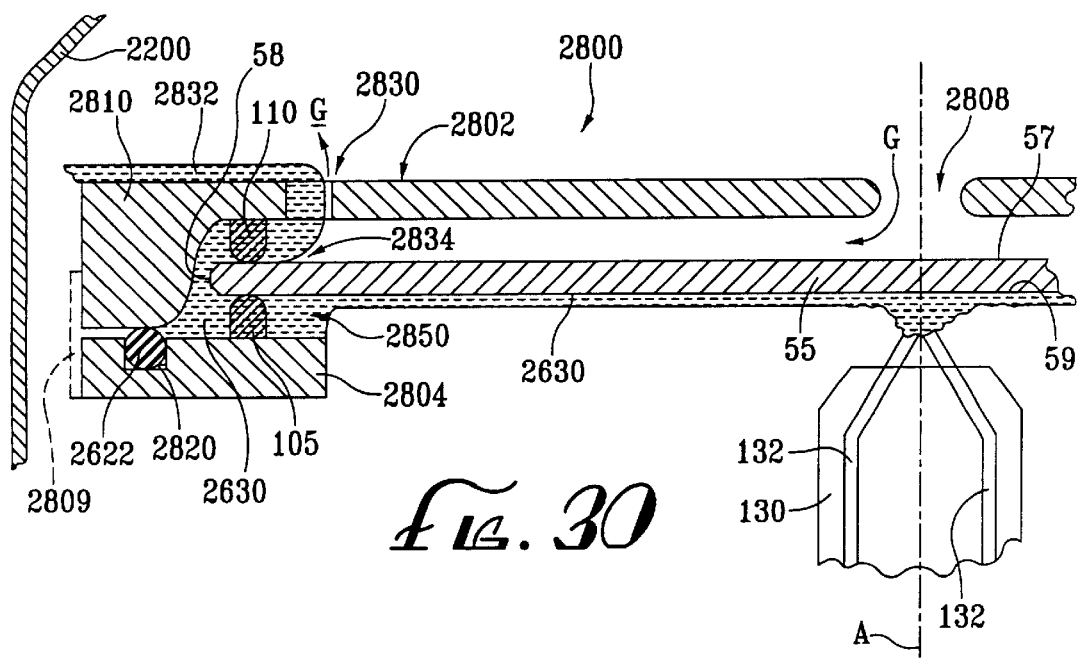

FIG. 30 shows yet another reactor embodiment 2800 having an upper rotor 2802 with an upper central opening 2808. A lower rotor 2804 may either have a web configuration, as shown in FIG. 28, or it may mechanically attach to the upper rotor 2802 via an attachment 2809. A flange 2810 on the upper rotor 2802 seals against the lower rotor 2804 via an o-ring 2622 in a groove 2820 in the lower rotor 2804. The wafer or other workpiece 55 is supported between the rotors on supports 105 and 110, as described above. A drain hole 2830 extends through the upper rotor 2802, just inside the reservoir 2850 formed by the flange 2810 of the upper rotor 2802 and the lower rotor 2804.

In use, processing fluid 2630 is introduced onto the lower surface 59 of the wafer 55 at the center (on the axis A). Preferably, the fluid is introduced via a nozzle 130 having multiple jets 132. The fluid 2630 flows radially outwardly on the bottom surface 59 and fills the reservoir 2850. The fluid runs out from the drain hole 2830, creating a separation line 2834, cleanly separating the processed outside annular area of the upper surface 57 of the wafer 55, from the unprocessed inner surface. Purged gas is preferably introduced through the upper central opening 2808 and exhausts out of the drain hole 2830. The purge gas keeps the area above the top surface 57 free of fluid vapors. Purge gas may also be used in the reactors 2600 and 2700.

In the embodiment shown in FIGS. 29 and 30, a single drain hole, or multiple drain holes may be used. The reactors shown in FIGS. 27–30, except as described above in connection with FIGS. 27–30, operate (e.g., in terms of their fluid delivery, rotor spin, rotor design, etc.) in the same way as the reactors shown in FIGS. 1, 2, 14 and 18.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the inventions. The inventions therefore, should not be limited, except by the following claims, and their equivalents.

What is claimed is:

1. An apparatus for processing a microelectronic workpiece, comprising:
   a first rotor;
   a second rotor engagable with the first rotor;
   the first rotor and the second rotor forming an annular chamber, when the first and second rotors are engaged, with the annular chamber rotatable about a spin axis;
   a plurality of spacing members for holding the workpiece, with at least a perimeter area of the workpiece in the annular chamber, and with the annular chamber adapted to confine fluid around the perimeter area of the workpiece when the annular chamber is spinning.

2. The apparatus of claim 1 further comprising a fluid supply opening positioned to introduce a processing fluid to a central area of the workpiece.

3. The apparatus of claim 1 with the annular chamber having a top surface, a bottom surface and an outside wall surface, formed by the first and second rotors.

4. The apparatus of claim 3 where the workpiece has a flat surface and the outside wall surface is perpendicular to the flat surface of the workpiece.

5. The apparatus of claim 4 where the outside wall surface is vertical and the flat surface of the workpiece is horizontal, so that fluid on the flat surface of the workpiece flows radially outwardly equally in all directions over the flat workpiece surface, via centrifugal force, when the workpiece rotates with the annular chamber.

6. The apparatus of claim 1 further comprising a seal between the first and second rotors, with the seal having a diameter greater than the diameter of the chamber.

7. The apparatus of claim 1 further including a spin motor connected to at least one of the first and second rotors.

8. The apparatus of claim 1 further comprising an outlet in at least one of the first and second rotors, with the outlet located between the annular chamber and the spin axis of the rotors.

9. The apparatus of claim 8 where the at least one outlet is spaced inwardly from the edge of the workpiece by about 1–5 mm.

10. The apparatus of claim 1 further comprising means for moving the first and second rotors apart, for loading and unloading a workpiece, and for moving them together for processing a workpiece.

11. The apparatus of claim 1 with at least one of the first and second rotors including a web plate attached to a drive shaft.

12. The apparatus of claim 1 further comprising spacing members extending into the annular chamber.

13. The apparatus of claim 1 where the workpiece is a round and flat and the annular chamber is round.

14. The apparatus of claim 13 where the perimeter area of the workpiece within the annular chamber extends inwardly about 1–5 mm from the edge of the workpiece.

15. An apparatus for processing a workpiece, comprising:
   a rotor including a first chamber member, and a second chamber member forming a processing chamber;
   a first inlet in the first chamber member;
   one or more outlets in at least one of the first and second chamber members; and
   a seal sealing a perimeter of the first and second chamber members.

16. The apparatus of claim 15 further comprising an array of spaced apart outlets in at least one of the first and second chamber members, with each outlet positioned at a uniform radial distance from the spin axis of the rotor.

17. The apparatus of claim 15 where the rotor has a vertical spin axis and the first chamber member above the second chamber member.

18. The apparatus of claim 15 further including a nozzle having at least two ports for directing two or more streams of processing fluid towards the workpiece; to cause the streams to converge where they reach the workpiece.

19. The apparatus of claim 15 further comprising a head enclosing the rotor, and a base under the head, with the base including an annular plenum coaxial with the spin axis, for collecting spent fluid and draining it away from the rotor.

20. The apparatus of claim 19 further comprising a plurality of drain openings in the annular plenum, with a drain valve in each opening.

21. The apparatus of claim 20 wherein the rotor further comprises a ribbed surface facing a smooth surface of the head, so that spinning movement of the rotor swirls air to sweep fluids towards the drains.

22. The apparatus of claim 15, further comprising an annular skirt attached to the first chamber member and extending towards the second chamber member.

23. The apparatus of claim 15 further comprising means for moving the first and second chamber members together and apart.

24. The apparatus of claim 15 where the one or more outlets is positioned between a spin axis of the processing chamber and the seal.

25. The apparatus of claim 15 further comprising a second inlet in the second chamber member.

26. The apparatus of claim 25 with the first and second inlets each connected to either a fluid source or a gas source.

27. An apparatus for processing a workpiece, comprising:
   a rotor including a first chamber member, and a second chamber forming a processing chamber between them;
   a first inlet in the first chamber member;
   an aligning ring having a plurality of openings, the aligning ring attached to and concentric with the second chamber member;
   an actuating ring below the aligning ring, the actuating ring having a plurality of upwardly extending pins, with each pin aligned with one of the openings in the aligning ring; and
   an actuator ring driver below the actuating ring, for raising and lowering the actuating ring.

28. The apparatus of claim 27 wherein the actuator ring driver comprises a plurality of pneumatic devices.

29. The apparatus of claim 27 further comprising means for latching the first and second chamber members together.

30. The apparatus of claim 27 further comprising:
   an array of spaced apart outlets each positioned at a uniform radial distance from the spin axis of the rotor; and
   a seal on the second chamber member sealing a perimeter of the first and second chamber members, when the first and second chamber members are engaged together.

31. An apparatus for processing a workpiece, comprising:
   a rotor including a first chamber member and a second chamber member forming a processing chamber between them;
   an first inlet in the first chamber member;
   an outlet in at least one of the first and second chamber members;
   a latching mechanism for latching the first and second chamber members together, during processing, the latching mechanism comprising:

a latching ring retained by the second chamber member the latching ring having a plurality of stepped portions radially displaceable to engage into and to disengage from recesses in the first chamber member;

a plurality of latching cams, with one latching cam associated with each of the stepped portions of the latching ring;

an actuating ring engageable against the latching cams, to move the cams into or out of the recesses in the first chamber member; and means for engaging the actuating ring against the latching cams.

32. The apparatus of claim 31 further comprising a workpiece lifting mechanism on the second chamber member, for lifting the workpiece away from the second chamber member, when the first chamber member is separated from the second chamber member.

33. The apparatus of claim 31 further comprising a plurality of levers pivotable attached to the second chamber member, with an elastic member continuously biasing the levers into a raised up position.

34. An apparatus for processing a workpiece, comprising:

a first rotor;

a second rotor engageable with the first rotor to form a chamber for holding the workpiece; and a plurality of spacing members adjacent to the perimeter of the workpiece, for holding the workpiece between the first and second rotors, with substantially each spacing member including a lifting lever pivotably attached to the first rotor and a lifting lever driver acting to constantly force the lifting lever towards the second rotor.

35. The apparatus of claim 34 where the lifting lever driver comprises an elastic member.

36. An apparatus for processing a workpiece, comprising:

a first rotor;

a second rotor;

the first rotor and the second rotor forming a ring shaped chamber having a vertical wall extending between an upper horizontal wall and a lower horizontal wall, and with the chamber rotatable about a spin axis; and a plurality of spacing members on at least one of the first and second rotors, for holding a workpiece between the first and second rotors.

37. The apparatus of claim 36 where at least part of one of the upper, lower and vertical walls is flat.

38. An apparatus for processing a microelectronic workpiece comprising:

a top rotor;

a bottom rotor engaged with the top rotor;

with the top and bottom rotors forming a process chamber for holding and processing a microelectronic workpiece;

spacing members extending out of the top and bottom rotors to support the microelectronic workpiece spaced apart from the top and bottom rotors; and means for confining a process fluid to a defined perimeter area on a top or bottom surface of the microelectronic workpiece, via centrifugal force.

39. The apparatus of claim 38 where the means for confining comprises the rotors surrounding the perimeter area of the microelectronic workpiece on three sides.

* * * * *

UNITED STATES PATENT AND TRADEMARK OFFICE
CERTIFICATE OF CORRECTION

PATENT NO.    : 6,447,633 B1
DATED         : September 10, 2002
INVENTOR(S)   : Steven L. Peace et al.

It is certified that error appears in the above-identified patent and that said Letters Patent is hereby corrected as shown below:

<u>Title page,</u>
Item [73], Assignee, "Semitdol, Inc." should read -- Semitool, Inc. --

Signed and Sealed this

Twenty-seventh Day of May, 2003

JAMES E. ROGAN
*Director of the United States Patent and Trademark Office*